United States Patent [19]
Mizoh et al.

[11] Patent Number: 5,602,473
[45] Date of Patent: Feb. 11, 1997

[54] METHOD AND APPARATUS FOR ANALYSIS OF MAGNETIC CHARACTERISTICS OF MAGNETIC DEVICE, MAGNETIC HEAD, AND MAGNETIC RECORDING AND REPRODUCING APPARATUS

[75] Inventors: Yoshiaki Mizoh, Neyagawa; Koichi Osano, Osaka; Masaya Sakaguchi, Neyagawa, all of Japan

[73] Assignee: Matsushita Electric Industrial Co., Ltd., Osaka, Japan

[21] Appl. No.: 390,782

[22] Filed: Feb. 17, 1995

[30] Foreign Application Priority Data

Feb. 18, 1994 [JP] Japan .................................. 6-021035
Jan. 12, 1995 [JP] Japan .................................. 7-003482

[51] Int. Cl.$^6$ ............................. G01B 7/24; G01B 7/14
[52] U.S. Cl. ........................................ 324/209; 364/560
[58] Field of Search ..................................... 324/209, 225, 324/239, 234, 210–212; 364/560, 563, 508, 571.01, 571.08; 83/862.473, 862.474

[56] References Cited

U.S. PATENT DOCUMENTS 4,408,160  10/1983  King et al. .............................. 324/209
5,012,189   4/1991  Jiles ........................................ 324/209
5,195,377   3/1993  Garshelis ................................. 324/209
5,307,291   4/1994  Kita et al. ............................... 364/560

Primary Examiner—Sandra L. O'Shea
Assistant Examiner—Roger Phillips
Attorney, Agent, or Firm—Fish & Richardson P.C.

[57] ABSTRACT

A method and apparatus for analysis of magnetic characteristics of a magnetic device used for designing a magnetic head. The magnetic head has recording and reproducing characteristics and a recording and reproducing apparatus of magnetic characteristics. The apparatus for analysis of magnetic characteristics includes a data input part, a coupled analysis part, and a result output part. The data input part is provided with data related to the characteristics of substances composing the magnetic device, data related to the magnetic device divided into a plurality of parts, data concerning the boundary conditions for analysis of the magnetic device, and data concerning the boundary conditions for analysis of the magnetic field. In the analysis part, a stress distribution for each of the plurality of parts divided on the basis of the data related to the boundary conditions input from the data input part is obtained, and magnetic characteristics for each of the plurality of parts based on the data concerning the boundary conditions of the magnetic field and the stress distribution of the magnetic device are obtained, and magnetic characteristics of the whole magnetic device are obtained based on the magnetic characteristics of each of the plurality of parts.

13 Claims, 17 Drawing Sheets

METHOD AND APPARATUS FOR ANALYSIS OF MAGNETIC CHARACTERISTICS OF MAGNETIC DEVICE, MAGNETIC HEAD, AND MAGNETIC RECORDING AND REPRODUCING APPARATUS

FIELD OF THE INVENTION

This invention relates to a magnetic recording equipment used for an audio equipment, a video equipment, an information equipment etc., or relates to a magnetic device such as a transformer and a coil. This invention further relates to a method and an apparatus for analysis of magnetic characteristics, a magnetic head, and a recording apparatus for the aforementioned equipments and devices.

BACKGROUND OF THE INVENTION

As far as a video tape recorder (VTR) and a Digital Audio Tape (DAT) are concerned, a bulk type magnetic head 38 in FIG. 5 (a), a metal-in-gap type magnetic head 39 in FIG. 5 (b), and a laminate type magnetic head 40 in FIG. 5 (c) etc. are used. The bulk type magnetic head 38 shown in FIG. 5 (a) comprises at least a magnetic substance 42 such as ferrite, sendust, and permalloy which forms a magnetic path, a magnetic gap 41, and a non magnetic material 43 such as glass for fixing two cores of magnetic circuits 47, 48 which form the magnetic gap. The metal-in-gap type magnetic head 39 shown in FIG. 5 (b) comprises at least a high magnetic saturation substance 44 such as a metal film which forms a magnetic path in the vicinity of a magnetic gap, a magnetic substance 42 such as ferrite, sendust, permalloy etc. which forms the magnetic path besides the vicinity of the gap, a magnetic gap 41, and a non magnetic material 43. The laminate type magnetic head 40 shown in FIG. 5 (c) comprises at least a magnetic substance 45 forming a magnetic path, a magnetic gap 41, and a non magnetic material 46 such as ceramics for supporting the magnetic substance.

Conventionally, with regard to the bulk type magnetic head 38 and the laminate type magnetic head 40, a magnetic path was composed of magnetically equal materials (magnetic substances 42, 45) and initial permeability was also considered as being isotropic and equal. In case of the metal-in-gap type magnetic head 39, although the high magnetic saturation substance 44 such as a metal film which forms the gap part and the other part 42 of the magnetic substance have different initial permeability, each of the initial permeability was also considered as being isotropic and constant. However, a single crystal ferrite or a magnetic thin film generally has anisotropy in crystal, so that the initial permeability also differs according to the azimuth. Therefore, it can be anticipated that magnetic recording characteristics change in accordance to the azimuth. Furthermore, the non magnetic material 43 such as glass etc. is used for bonding two cores 47 and 48, and depending on the type of this non magnetic material 43, magnetic recording characteristics of the magnetic head 39 differed greatly. Probably, this was due to the fact that the magnetic characteristics of the magnetic material changed by thermal stress caused by the difference of thermal expansion coefficients between the non magnetic material 43 and the magnetic material 44 composing the magnetic path. However, since these phenomena are complicated and difficult to analyze, composite substances of a magnetic head were selected and the size of the head was designed on the basis of experiences.

A conventional method for analysis of magnetic characteristics will be explained in an example of a magnetic head as one of a typical magnetic devices.

Now, Maxwell's fundamental equations of electromagnetic field which rule the electromagnetic field are shown in the following equations 1 to 4 (Finite Element Method of Electrical Engineering, Autor: Takayoshi Nakada, Publisher: Morikita Shuppan, 1982).

$$\text{rot } H = J + \frac{dD}{dt} \qquad \text{(equation 1)}$$

$$\text{rot } E = -\frac{dB}{dt} \qquad \text{(equation 2)}$$

$$\text{div } B = 0 \qquad \text{(equation 3)}$$
$$\text{div } D = \rho \qquad \text{(equation 4)}$$

In the above-noted equations, B represents a magnetic flux density, H represents a magnetic field strength, D represents a dielectric flux density, E represents field strength, J represents a current density, t represents time, and ρ represents a charge density. A magnetic flux distribution and a magnetic field distribution comprising magnetic characteristics can be obtained by solving the equations 1 to 4 in combination under appropriate boundary conditions.

In a conventional method of analyzing magnetic characteristics of a magnetic device, the equations 1 to 4 are solved in combination under optional boundary conditions, for example, with a continuous magnetic flux, to obtain a magnetic flux distribution and a magnetic field distribution by forming magnetic flux continuously. By referring to a method of analyzing magnetic characteristics of a magnetic head by using the finite element method, a magnetic body comprising a magnetic path is divided into several elements, and these boundary conditions and material characteristics of each element and initial permeability μ or a curve of magnetic flux density—magnetic field strength (B—H curve) are input in an apparatus for analysis of magnetic characteristics. The conventional method for analysis of magnetic characteristics was conducted such that the magnetic characteristics such as the curve of magnetic flux density—magnetic field or the initial permeability defined as the equation 5 were measured in advance, and the measured data were provided at an input part of the apparatus for analysis of magnetic characteristics.

$$\mu = \left| \frac{dB}{dH} \right| H \to 0 \qquad \text{(equation 5)}$$

On the other hand, the direction of an easy axis of a magnetic substance is determined by an angle formed with a magnetic field, and initial permeability changes depending upon this angle. In other words, when magnetic characteristics of a magnetic device are analyzed by using initial permeability, even if the initial permeability of each part change depending on the direction of a magnetic moment in each part of the magnetic device, the initial permeability were input in a conventional apparatus for analysis of magnetic records without taking the direction of the magnetic moment in each part into consideration.

Similarly, a curve of magnetic flux density—magnetic field strength also changes the optimum point of energy due to the direction of an external magnetic field, and a magnetic flux within a magnetic body changes the flowing direction. Therefore, when the flow of magnetic flux in the entire device is obtained by using the same curve of magnetic flux density—magnetic field strength and the equation 3 which shows the continuity of magnetic flux, the results obtained do not hold good for the actual state.

Furthermore, when a single crystal magnetic material or a magnetic thin film is used, initial permeability or a curve of magnetic flux density—magnetic field differ greatly according to the azimuth. In addition, the initial permeability or the curve of magnetic flux density—magnetic field also changes in accordance to internal stress possessed by the magnetic device. However, it was impossible to obtain the initial permeability or the curve of magnetic field—magnetic flux density for each azimuth of respective material or element composing the magnetic device.

Moreover, when a magnetic device is composed of a plurality of magnetic substances and non magnetic substances, and when each substance has different thermal and internal stress, it was hardly taken into consideration how the magnetic characteristics in each part or in the entire magnetic device changed.

SUMMARY OF THE INVENTION

It is an objective of this invention is to solve the above-mentioned problems in the conventional methods by providing a method and an apparatus for analysis of magnetic characteristics of a magnetic device which are used for designing excellent magnetic heads. A further objective of this invention is to provide a magnetic head having excellent recording and reproducing characteristics. A further objective of this invention is to provide an excellent magnetic recording and reproducing apparatus.

In order to accomplish these and other objects and advantages, a method for analysis of magnetic characteristics of a magnetic device of this invention is conducted by measuring magnetic characteristics of the magnetic device composed of a magnetic material and a non magnetic material with the use of an analysis apparatus, and comprises the steps of inputting data related to characteristics of the substances composing the magnetic device, data related to structure of the magnetic device divided into a plurality of parts, data concerning boundary conditions for analysis of the structure of the magnetic device, and data concerning boundary conditions for analysis of a magnetic field of the magnetic device into the analysis apparatus, obtaining a stress distribution for each of the plurality of divided parts on the basis of the data related to the boundary conditions, obtaining magnetic characteristics for each of the plurality of parts based on the data concerning the boundary conditions of the magnetic field and the stress distribution of the magnetic device, and obtaining magnetic characteristics of the whole magnetic device based on the magnetic characteristics for each of the plurality of parts.

It is preferable that magnetic characteristics of the entire magnetic device are obtained by solving an equation for obtaining magnetic flux and direction of magnetic flux for each of the plurality of parts by using the data related to the boundary conditions for analysis of the magnetic field and the stress distribution of the magnetic device, in combination and simultaneously with an equation for obtaining magnetic characteristics of the whole magnetic device from the continuous formulas of magnetic flux.

Furthermore, it is preferable that convergence solutions of magnetic characteristics of the entire magnetic device are obtained by solving an equation for obtaining magnetic flux and direction of magnetic flux for each of the plurality of parts by using the data related to the boundary conditions for analysis of the magnetic field and the stress distribution of the magnetic device, alternately with an equation for obtaining magnetic characteristics of the whole magnetic device from the continuous formulas of magnetic flux.

In addition, it is preferable that magnetic characteristics of the entire magnetic device are obtained by solving an equation for obtaining an absolute value of initial permeability and anisotropy of initial permeability for each of the plurality of parts by using the data related to the boundary conditions for analysis of the magnetic field and the stress distribution of the magnetic device, in combination and simultaneously with an equation for obtaining magnetic characteristics of the whole magnetic device from the continuous formulas of magnetic flux.

It is also preferable that convergence solutions of magnetic characteristics of the whole magnetic device are obtained by solving an equation for obtaining an absolute value of initial permeability and anisotropy of initial permeability for each of the plurality of parts by using the data related to the boundary conditions for analysis of the magnetic field and the stress distribution of the magnetic device, alternately with an equation for obtaining magnetic characteristics of the whole magnetic device from the continuous formulas of magnetic flux.

It is preferable that the magnetic device comprises a magnetic head, and stress imposed on the plurality of parts is at least one force selected from the group consisting of thermal stress caused by the difference of thermal expansion coefficients in the composite material and pressure added externally, and the magnetic characteristics comprise at least one of the magnetic recording characteristics selected from the group consisting of strength of magnetic field generated at a magnetic gap part by an excited coil and magnetic strength of a magnetic medium body.

Furthermore, it is preferable that the magnetic device comprises a magnetic head, and stress imposed on the plurality of parts is at least one force selected from the group consisting of thermal stress caused by the difference of thermal expansion coefficients in the composite material and pressure added externally, and the magnetic characteristics comprise at least one of the magnetic recording and reproducing characteristics selected from the group consisting of magnetic flux density at a magnetic gap part, electromotive force caused in a coil disposed at the interlinkage with a magnetic circuit, and amount of magnetic flux at the interlinkage with the coil.

In addition, it is preferable that an equation for obtaining magnetic characteristics against a magnetic field for each of the plurality of parts by using the data related to the boundary conditions for analysis of the magnetic field and the stress distribution of the magnetic device solves at least one equation of motion selected from the group consisting of a domain wall motion and a magnetization rotation, has frequency dependency including a damping-constant, and obtains frequency dependency of the magnetic device.

A second embodiment of this invention is an apparatus for analysis of magnetic characteristics of a magnetic device used for measuring magnetic characteristics of a magnetic device composed of a magnetic material and a non magnetic material, and comprises at least a data input part, in which data related to characteristics of substances composing the magnetic device, data related to structure of the magnetic device divided into a plurality of parts, data concerning boundary conditions for analysis of the structure, and data concerning boundary conditions for analysis of a magnetic field of the magnetic device are input, and an analysis part, in which a stress distribution for each of the plurality of parts divided on the basis of the data related to the boundary conditions is obtained, and magnetic characteristics for each of the plurality of parts based on the data concerning the boundary conditions and the stress distribution are obtained, and magnetic characteristics of the whole magnetic device based on the magnetic characteristics for each of the plurality of parts are obtained.

A third embodiment of this invention is a magnetic head. A first configuration of the magnetic head comprises a form and magnetic substances selected most suitably by measuring magnetic characteristics of the magnetic head composed of a magnetic material and a non magnetic material with the use of an analysis apparatus, and comprises the steps of inputting data related to characteristics of the substances composing the magnetic head, data related to structure of the magnetic head divided into a plurality of parts, data concerning boundary conditions for analysis of the structure of the magnetic head, and data concerning boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic characteristics for each of the plurality of parts based on the data concerning the boundary conditions for analysis of the magnetic field and the stress distribution of the magnetic head including at least one strength selected from the group consisting of strength of magnetic field generated at a magnetic gap part by an excited coil and magnetic strength of a magnetic recording medium, and obtaining magnetic recording characteristics of the whole magnetic head based on the magnetic recording characteristics for each of the plurality of parts.

A second configuration of the magnetic head of this invention has a form and magnetic substances selected most suitably by measuring magnetic characteristics of the magnetic head composed of a magnetic material and a non magnetic material with the use of an analysis apparatus, and comprises the steps of inputting data related to characteristics of the substances composing the magnetic head, data related to structure of the magnetic head divided into a plurality of parts, data concerning boundary conditions for analysis of the structure of the magnetic head, and data concerning boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic recording and reproducing characteristics for each of the plurality of parts based on the data concerning the boundary conditions for analysis of the magnetic field and the stress distribution of the magnetic head including at least one element selected from the group consisting of magnetic flux density at a magnetic gap part, electromotive force caused in a coil disposed at the interlinkage with a magnetic circuit, and amount of magnetic flux at the interlinkage with the coil, and obtaining magnetic recording characteristics of the whole magnetic head based on the magnetic recording and reproducing characteristics for each of the plurality of parts.

A fourth embodiment of this invention is a magnetic recording and reproducing apparatus. A first configuration of the magnetic recording and reproducing apparatus conducts recording and reproducing of information by relatively moving a magnetic head composed of a magnetic material and a non magnetic material and a magnetic medium, and has a form and magnetic substances selected most suitably by measuring magnetic characteristics of the magnetic head with the use of an analysis apparatus, and comprises the steps of inputting data related to characteristics of the substances composing the magnetic head, data related to structure of the magnetic head divided into a plurality of parts, data concerning boundary conditions for analysis of the structure of the magnetic head, and data concerning the boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic characteristics for each of the plurality of parts on the basis of the data concerning the boundary conditions for analysis of the magnetic field and the stress distribution of the magnetic head including at least one strength selected from the group consisting of strength of magnetic field generated at a magnetic gap part by an excited coil and magnetic strength of a magnetic recording medium, and obtaining magnetic recording characteristics of the whole magnetic head based on the magnetic recording characteristics for each of the plurality of parts.

A second configuration of the magnetic recording and reproducing apparatus of this invention conducts recording and reproducing of information by relatively moving a magnetic head composed of a magnetic material and a non magnetic material and a magnetic medium, and has a form and magnetic substances selected most suitably by measuring magnetic characteristics of the magnetic head with the use of an analysis apparatus, and comprises the steps of inputting data related to characteristics of the substances composing the magnetic head, data related to structure of the magnetic head divided into a plurality of parts, data concerning boundary conditions for analysis of the structure of the magnetic head, and data concerning boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic characteristics for each of the plurality of parts on the basis of the data concerning the boundary conditions for analysis of the magnetic field and the stress distribution of the magnetic head including at least one element selected from the group consisting of magnetic flux density at a magnetic gap part, electromotive force caused in a coil disposed at the interlinkage with a magnetic circuit, and amount of magnetic flux at the interlinkage with the coil, and obtaining magnetic recording characteristics of the whole magnetic head based on the magnetic recording and reproducing characteristics for each of the plurality of parts.

A third configuration of the magnetic head of this invention comprises a ring type magnetic head for sending and receiving signals with a magnetic medium, wherein a curve of magnetic flux density—magnetic field strength at rubbing direction differs from a curve of magnetic flux density—magnetic field strength at gap depth direction of the magnetic medium of substances comprising a magnetic circuit, and each substance has a higher curve of magnetic flux density—magnetic field strength than in the time of no stress.

A fourth configuration of the magnetic head of this invention comprises a ring type magnetic head for sending and receiving signals with a magnetic medium, wherein a material having a different thermal expansion coefficient from that of a material composing the head is bonded on the side of the head.

It is preferable that the material composing the head includes at least ferrite, and the ferrite has a negative magnetostriction constant, and a material having a smaller thermal expansion coefficient than that of the ferrite is bonded at a part where a magnetic path on the side of the head is formed at gap depth direction.

Furthermore, it is preferable that the material bonded at a part where a magnetic path on the side of the head is formed at gap depth direction comprises glass having a smaller thermal expansion coefficient than that of the ferrite.

In addition, it is preferable that the material composing the head includes at least ferrite, and the ferrite has a positive magnetostriction constant, and a material having a larger thermal expansion coefficient than that of the ferrite is bonded at a part where a magnetic path on the side of the head is formed at gap depth direction.

A third configuration of the magnetic recording and reproducing apparatus of this invention conducts recording and reproducing of information by relatively moving a ring type magnetic head and a magnetic medium, wherein a material having a different thermal expansion coefficient from that of a material composing the head is bonded on the side of the head.

A fifth configuration of the magnetic head of this invention comprises a ring type magnetic head for sending and receiving signals with a magnetic medium, wherein initial permeability $\mu_1$ at rubbing direction and initial permeability at gap depth direction of the magnetic medium of substances comprising a magnetic circuit meet the following equation 17:

$$1.1 < \frac{\mu_1}{\mu_2} < 1.4 \quad \text{(equation 17)}$$

A sixth configuration of the magnetic head of this invention comprises a ring type magnetic head for sending and receiving signals with a magnetic medium, wherein at least ferrite is used at one part of a composite material comprising a magnetic circuit of the magnetic head, and initial permeability $\mu_3$ at rubbing direction and initial permeability $\mu_4$ at gap depth direction of the magnetic medium of the ferrite meet the following equation 18:

$$1.1 < \frac{\mu_3}{\mu_4} < 1.4 \quad \text{(equation 18)}$$

A seventh configuration of the magnetic head of this invention comprises a ring type magnetic head for sending and receiving signals with a magnetic medium, wherein at least a material composing the head is a bonded ferrite of a single crystal ferrite and a polycrystal ferrite, and a rubbing side of the magnetic medium has initial permeability $\mu_5$ at rubbing direction of the magnetic medium with the single crystal ferrite, and the part which does not rub with the magnetic medium has initial permeability $\mu_6$ magnetically isotropic with the polycrystal ferrite, and permeabilities $\mu_5$ and $\mu_6$ meet the following equation 19:

$$1.1 < \frac{\mu_5}{\mu_6} < 1.4 \quad \text{(equation 19)}$$

According to the method for analysis of magnetic characteristics of a magnetic device of this invention, the method is conducted by measuring magnetic characteristics of the magnetic device composed of a magnetic material and a non magnetic material with the use of an analysis apparatus, and comprises the steps of inputting data related to characteristics of the substances composing the magnetic device, data related to structure of the magnetic device divided into a plurality of parts, data concerning boundary conditions for analysis of the structure of the magnetic device, and data concerning boundary conditions for analysis of a magnetic field of the magnetic device into the analysis apparatus, obtaining a stress distribution for each of the plurality of divided parts based on the data related to the boundary conditions, obtaining magnetic characteristics for each of the plurality of parts on the basis of the data concerning the boundary conditions of the magnetic field and the stress distribution of the magnetic device, and obtaining magnetic characteristics of the whole magnetic device based on the magnetic characteristics for each of the plurality of parts. As a result, it is possible to obtain magnetic characteristics accurately in accordance to the realities, even if magnetic characteristics change in a complicated way due to stress generated within a magnetic device.

It is preferable that magnetic characteristics of the entire magnetic device are obtained by solving an equation for obtaining magnetic flux and direction of magnetic flux for each of the plurality of parts by using the data related to the boundary conditions for analysis of the magnetic field and the stress distribution of the magnetic device, in combination and simultaneously with an equation for obtaining magnetic characteristics of the whole magnetic device from the continuous formulas of magnetic flux. Accordingly, instability of solutions caused by having a non-linear part or divergence of solutions can be avoided, so that convergence solutions can be obtained stably.

Furthermore, it is preferable that convergence solutions of magnetic characteristics of the entire magnetic device are obtained by solving an equation for obtaining magnetic flux and direction of magnetic flux for each of the plurality of parts by using the data related to the boundary conditions for analysis of the magnetic field and the stress distribution of the magnetic device, alternately with an equation for obtaining magnetic characteristics of the whole magnetic device from the continuous formulas of magnetic flux. Thus, a scale of the matrix can be reduced and present calculators can be used effectively, so that it is possible to calculate in a practical time.

In addition, it is preferable that magnetic characteristics of the entire magnetic device are obtained by solving an equation for obtaining an absolute value of initial permeability and anisotropy of initial permeability for each of the plurality of parts by using the data related to the boundary conditions for analysis of the magnetic field and the stress distribution of the magnetic device, in combination and simultaneously with an equation for obtaining magnetic characteristics of the whole magnetic device from the continuous formulas of magnetic flux. Accordingly, instability of solutions caused by having a non-linear part or divergence of solutions can be avoided, so that convergence solutions can be obtained stably.

It is also preferable that convergence solutions of magnetic characteristics of the whole magnetic device are obtained by solving an equation for obtaining an absolute value of initial permeability and anisotropy of initial permeability for each of the plurality of parts by using the data related to the boundary conditions for analysis of the magnetic field and the stress distribution of the magnetic device, alternately with an equation for obtaining magnetic characteristics of the whole magnetic device from the continuous formulas of magnetic flux. Thus, a scale of the matrix can be reduced and present calculators can be used effectively, so that it is possible to calculate in a practical time.

It is preferable that the magnetic device comprises a magnetic head, and stress imposed on the plurality of parts is at least one force selected from the group consisting of thermal stress caused by the difference of thermal expansion coefficients in the composite material and pressure added externally, and the magnetic characteristics comprise at least one of the magnetic recording characteristics selected from the group consisting of strength of magnetic field generated at a magnetic gap part by an excited coil and magnetic strength of a magnetic medium body. As a result, structure, material, and manufacturing process of a magnetic head composed of various substances can be highly optimized, thereby obtaining a magnetic head having improved recording characteristics than a conventional one.

Furthermore, it is preferable that the magnetic device comprises a magnetic head, and stress imposed on the plurality of parts is at least one force selected from the group consisting of thermal stress caused by the difference of thermal expansion coefficients in the composite material and pressure added externally, and the magnetic characteristics comprise at least one of the magnetic recording and reproducing characteristics selected from the group consisting of magnetic flux density at a magnetic gap part, electromotive force caused in a coil disposed at the interlinkage with a magnetic circuit, and amount of magnetic flux at the interlinkage with the coil. Accordingly, structure, material, and manufacturing process of a magnetic head composed of various substances can be highly optimized, thereby obtaining a magnetic head having improved reproducing characteristics than a conventional one.

In addition, it is preferable that an equation for obtaining magnetic characteristics against a magnetic field for each of the plurality of parts by using the data related to the boundary conditions for analysis of the magnetic field and the stress distribution of the magnetic device solves at least one equation of motion selected from the group consisting of a domain wall motion and a magnetization rotation, has frequency dependency including a damping-constant, and obtains frequency dependency of the magnetic device. As a result, structure, material, and manufacturing process of a magnetic head composed of various substances can be highly optimized, thereby obtaining a magnetic head having excellent recording and reproducing characteristics up to high frequencies than a conventional one.

According to the second embodiment of this invention, the apparatus for analysis of magnetic characteristics of a magnetic device used for measuring magnetic characteristics of a magnetic device composed of a magnetic material and a non magnetic material comprises at least a data input part, in which data related to characteristics of the substances composing the magnetic device, data related to structure of the magnetic device divided into a plurality of parts, data concerning boundary conditions for analysis of the structure, and data concerning boundary conditions for analysis of a magnetic field of the magnetic device are input, and an analysis part, in which a stress distribution for each of the plurality of parts divided on the basis of the data related to the boundary conditions is obtained, and magnetic characteristics for each of the plurality of parts based on the data concerning the boundary conditions and the stress distribution are obtained, and magnetic characteristics of the whole magnetic device based on the magnetic characteristics for each of the plurality of parts are obtained. As a result, it is possible to obtain magnetic characteristics accurately in accordance to the realities, even if magnetic characteristics change in a complicated way due to stress generated within a magnetic device.

According to the first configuration of the magnetic head of this invention, the magnetic head has a form and magnetic substances selected most suitably by measuring magnetic characteristics of the magnetic head composed of a magnetic material and a non magnetic material with the use of an analysis apparatus, and comprises the steps of inputting data related to characteristics of substances composing the magnetic head, data related to structure of the magnetic head divided into a plurality of parts, data concerning boundary conditions for analysis of the structure of the magnetic head, and data concerning boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic characteristics for each of the plurality of parts based on the data concerning the boundary conditions for analysis of the magnetic field and the stress distribution of the magnetic head including at least one strength selected from the group consisting of strength of magnetic field generated at a magnetic gap part by an excited coil and magnetic strength of a magnetic recording medium, and obtaining magnetic recording characteristics of the whole magnetic head based on the magnetic recording characteristics for each of the plurality of parts. As a result, a magnetic head having excellent reproducing efficiency can be obtained.

According to the second configuration of the magnetic head of this invention, the magnetic head has a form and magnetic substances selected most suitably by measuring magnetic characteristics of the magnetic head composed of a magnetic material and a non magnetic material with the use of an analysis apparatus, and comprises the steps of inputting data related to characteristics of the substances composing the magnetic head, data related to structure of the magnetic head divided into a plurality of parts, data concerning boundary conditions for analysis of the structure of the magnetic head, and data concerning boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic recording and reproducing characteristics for each of the plurality of parts based on the data concerning the boundary conditions for analysis of the magnetic field and the stress distribution of the magnetic head including at least one element selected from the group consisting of magnetic flux density at a magnetic gap part, electromotive force caused in a coil disposed at the interlinkage with a magnetic circuit, and amount of magnetic flux at the interlinkage with the coil, and obtaining magnetic recording characteristics of the whole magnetic head based on the magnetic recording and reproducing characteristics for each of the plurality of parts. As a result, a magnetic head having excellent reproducing efficiency can be obtained.

According to the first configuration of the magnetic recording and reproducing apparatus of this invention, the magnetic recording and reproducing apparatus conducts recording and reproducing of information by relatively moving a magnetic head composed of a magnetic material and a non magnetic material and a magnetic medium, and has a form and magnetic substances selected most suitably by measuring magnetic characteristics of the magnetic head with the use of an analysis apparatus, and comprises the steps of inputting data related to characteristics of substances composing the magnetic head, data related to structure of the magnetic head divided into a plurality of parts, data concerning boundary conditions for analysis of the structure of the magnetic head, and data concerning boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic characteristics for each of the plurality of parts on the basis of the data concerning the boundary conditions for analysis of the magnetic field and the stress distribution of the magnetic head including at least one strength selected from the group consisting of strength of magnetic field generated at a magnetic gap part by an excited coil and magnetic strength of a magnetic recording medium, and obtaining magnetic recording characteristics of the whole magnetic head based on the magnetic recording characteristics for each of the plurality of parts. As a result, a magnetic head having excellent reproducing efficiency can be obtained.

According to the second configuration of the magnetic recording and reproducing apparatus of this invention, the magnetic recording and reproducing apparatus conducts recording and reproducing of information by relatively moving a magnetic head composed of a magnetic material and a non magnetic material and a magnetic medium, and has a form and magnetic substances selected most suitably by measuring magnetic characteristics of the magnetic head with the use of an analysis apparatus, and comprises the steps of inputting data related to characteristics of substances composing the magnetic head, data related to structure of the magnetic head divided into a plurality of parts, data concerning boundary conditions for analysis of the structure of the magnetic head, and data concerning boundary conditions for analysis of a magnetic field of the magnetic head into the analysis apparatus, obtaining at least one stress distribution selected from the group consisting of thermal stress caused by the difference of thermal expansion coefficients of the composite material and pressure added externally, obtaining magnetic characteristics for each of the plurality of parts on the basis of the data concerning the boundary conditions for analysis of the magnetic field and the stress distribution of the magnetic head including at least one element selected from the group consisting of magnetic flux density at a magnetic gap part, electromotive force caused in a coil disposed at the interlinkage with a magnetic circuit, and amount of magnetic flux at the interlinkage with the coil, and obtaining magnetic recording characteristics of the whole magnetic head based on the magnetic recording and reproducing characteristics for each of the plurality of parts. As a result, a magnetic head having excellent reproducing efficiency can be obtained.

According to the third configuration of the magnetic head of this invention, the magnetic head comprises a ring type magnetic head for sending and receiving signals with a magnetic medium, wherein a curve of magnetic flux density—magnetic field strength at rubbing direction differs from a curve of magnetic flux density—magnetic field strength at gap depth direction of the magnetic medium of substances comprising a magnetic circuit, and each substance has a higher curve of magnetic flux density—magnetic field strength than in the time of no stress. Thus, a magnetic head having higher recording and reproducing characteristics than that in the time of no stress can be obtained.

According to the fourth configuration of the magnetic head of this invention, the magnetic head comprises a ring type magnetic head for sending and receiving signals with a magnetic medium, wherein a material having a different thermal expansion coefficient from that of a material composing the head is bonded on the side of the head. In this way, stress is imposed on the material composing the head, and initial permeability of the material composing the head can be enhanced, so that it is effective for enhancing magnetic recording efficiency. It is preferable that the material composing the head includes at least ferrite, and the ferrite has a negative magnetostriction constant, and a material having a smaller thermal expansion coefficient than that of the ferrite is bonded at a part where a magnetic path on the side of the head is formed at gap depth direction. Thus, by imposing tensile stress on the ferrite, initial permeability of the side of the head at gap depth direction can be enhanced than that in the time of no stress. In addition, it is preferable that the material composing the head includes at least ferrite, and the ferrite has a positive magnetostriction constant, and a material having a larger thermal expansion coefficient than that of the ferrite is bonded at a part where a magnetic path on the side of the head is formed at gap depth direction. Similarly, by imposing tensile stress on the ferrite, initial permeability of the side of the head at gap depth direction can be enhanced than that in the time of no stress.

According to the third configuration of the magnetic recording and reproducing apparatus of this invention, the magnetic recording and reproducing apparatus conducts recording and reproducing of information by relatively moving a ring type magnetic head and a magnetic medium, wherein a material having a different thermal expansion coefficient from that of a material composing the head is bonded on the side of the head. As a result, it is possible to obtain a magnetic head having excellent recording and reproducing characteristics, wherein higher initial permeability of the side of the head at gap depth direction can be attained than that in the time of no stress, and a magnetic recording and reproducing apparatus having excellent recording and reproducing characteristics than that of a conventional one can be attained.

According to the fifth configuration of the magnetic head of this invention, the magnetic head comprises a ring type magnetic head for sending and receiving signals with a magnetic medium, wherein initial permeability $\eta_1$ at rubbing direction and initial permeability $\eta_2$ at gap depth direction of the magnetic medium of substances comprising a magnetic circuit meet the following equation 17:

$$1.1 < \frac{\mu_1}{\mu_2} < 1.4 \qquad \text{(equation 17)}$$

As a result, a magnetic head having excellent output characteristics can be obtained.

According to the sixth configuration of the magnetic head of this invention, the magnetic head comprises a ring type magnetic head for sending and receiving signals with a magnetic medium, wherein at least ferrite is used at one part of a composite material comprising a magnetic circuit of the magnetic head, and initial permeability $\mu_3$ at rubbing direction and initial permeability $\mu_4$ at gap depth direction of the magnetic medium of the ferrite meet the following equation 18:

$$1.1 < \frac{\mu_3}{\mu_4} < 1.4 \qquad \text{(equation 18)}$$

As a result, a magnetic head having excellent output characteristics can be obtained.

According to the seventh configuration of the magnetic head of this invention, the magnetic head comprises a ring type magnetic head for sending and receiving signals with a magnetic medium, wherein at least a material composing the head is a bonded ferrite of a single crystal ferrite and a polycrystal ferrite, and a rubbing side of the magnetic medium has initial permeability $\mu_5$ at rubbing direction of the magnetic medium with the single crystal ferrite, and the part which does not rub with the magnetic medium has initial permeability $\mu_6$ magnetically isotropic with the polycrystal ferrite, and permeabilities $\mu_5$ and $\mu_6$ meet the following equation 19:

$$1.1 < \frac{\mu_5}{\mu_6} < 1.4 \quad \text{(equation 19)}$$

As a result, a magnetic head having excellent output characteristics can be obtained.

DETAILED DESCRIPTION OF THE INVENTION

This invention will be explained by referring to the following illustrative examples and attached figures. The examples are not intended to limit the invention in any way.

First, an embodiment will be explained with the use of a magnetic head as one of typical magnetic devices.

Figure 5:
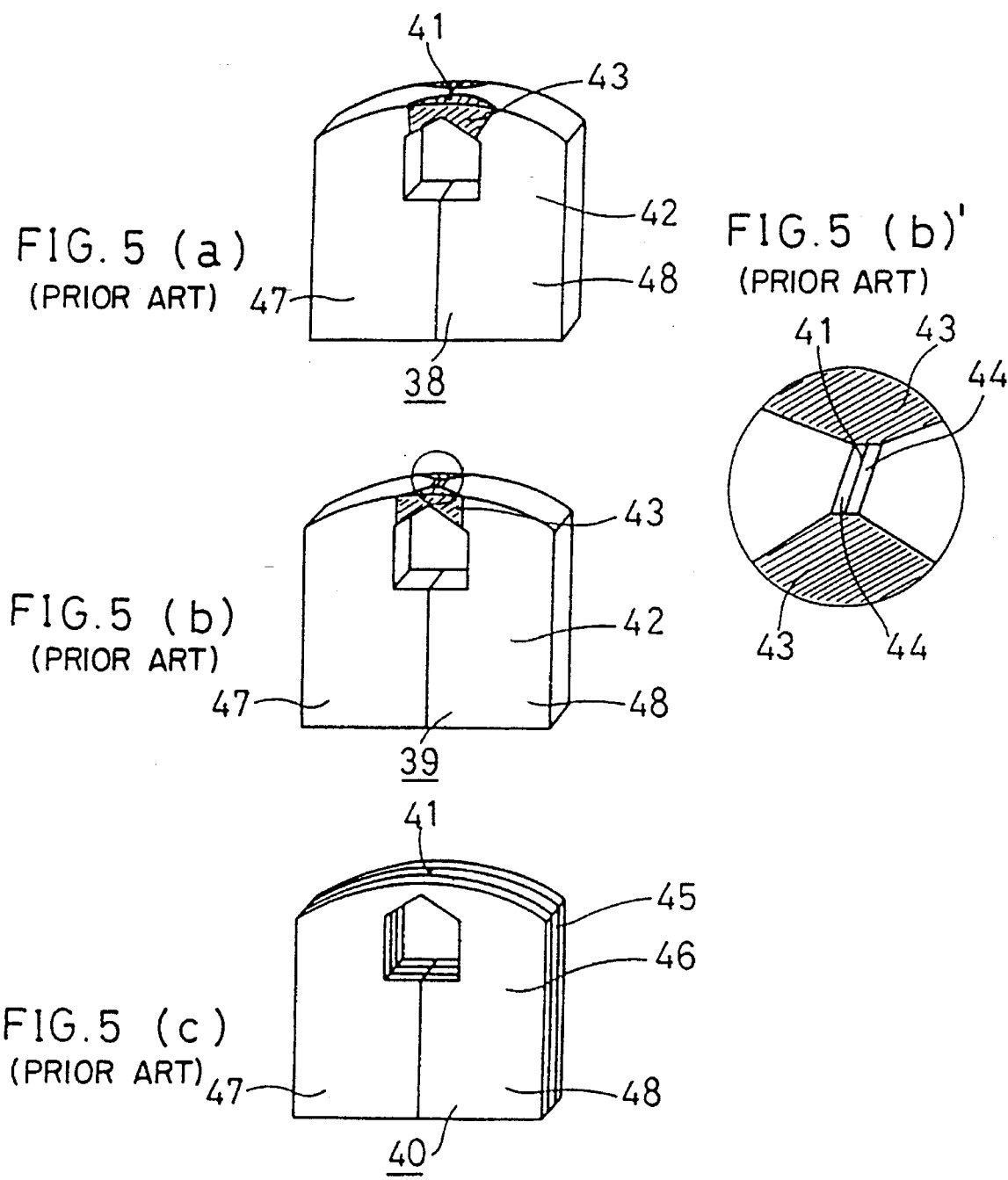
FIG. 5 (a) to (c) are perspective views showing a conventional magnetic head.

In the manufacturing process of a magnetic head, it is often so that an anneal step of about 200° C.–700° C. is included in order to remove distortions etc. caused while processing a magnetic substance. Furthermore, in the step of achieving bonding by using a non magnetic material 43 and the like such as glass etc. which is shown in FIG. 5 or in other steps, adhesion is accomplished by heating at the temperature of about 400°–800° C. and pressurizing by an external force. Therefore, stress is given to the magnetic substance by thermal stress caused by the difference of thermal expansion coefficients of the composite materials or by external force, and a curve of magnetic flux density—magnetic field strength changes through magnetostriction. Moreover, as shown in FIG. 5, since the magnetic head has a complicated form, the distribution of stress becomes complicated as well. As a result, the distribution of the curve of magnetic flux density—stress becomes complicated. Accordingly, it is necessary to make a tremendous effort for obtaining an optimum combination of initial permeability and form. It is effective to use an apparatus for analysis of magnetic characteristics in order to obtain this optimum combination of initial permeability and form, and also to obtain combinations of thermal expansion coefficients between the magnetic substances 42, 44, 45 etc. and the non magnetic materials 41, 43, 46 etc.

EXAMPLE 1

Figure 1:
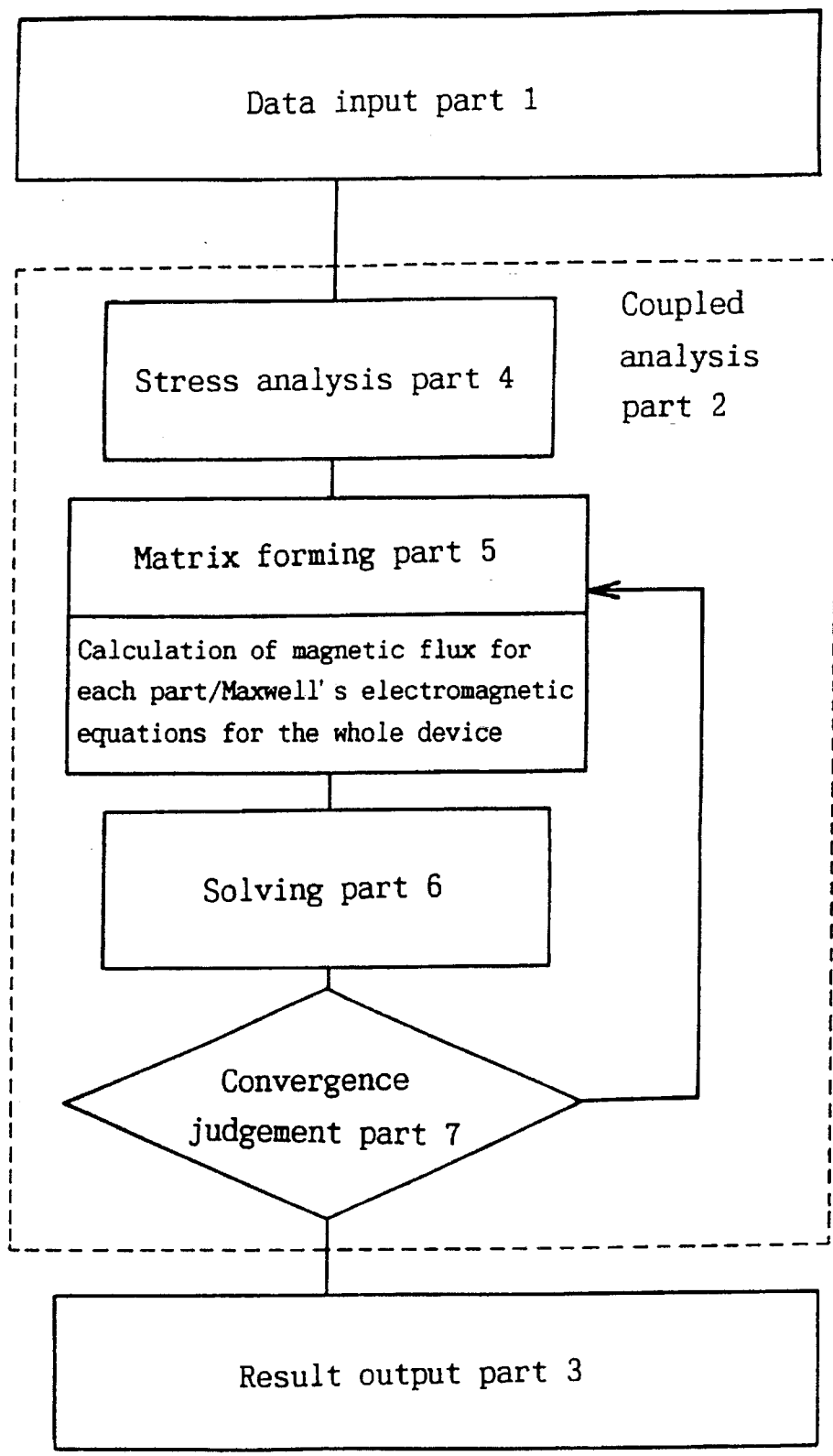
FIG. 1 is a flow chart showing a first embodiment of a method for analysis of magnetic recording characteristics of this invention.

FIG. 1 is a flow chart showing a first embodiment of a method for analysis of magnetic recording characteristics of this invention. An apparatus for analysis of magnetic characteristics comprises a data input part 1, a coupled analysis part 2, and a result output part 3.

Figure 7:
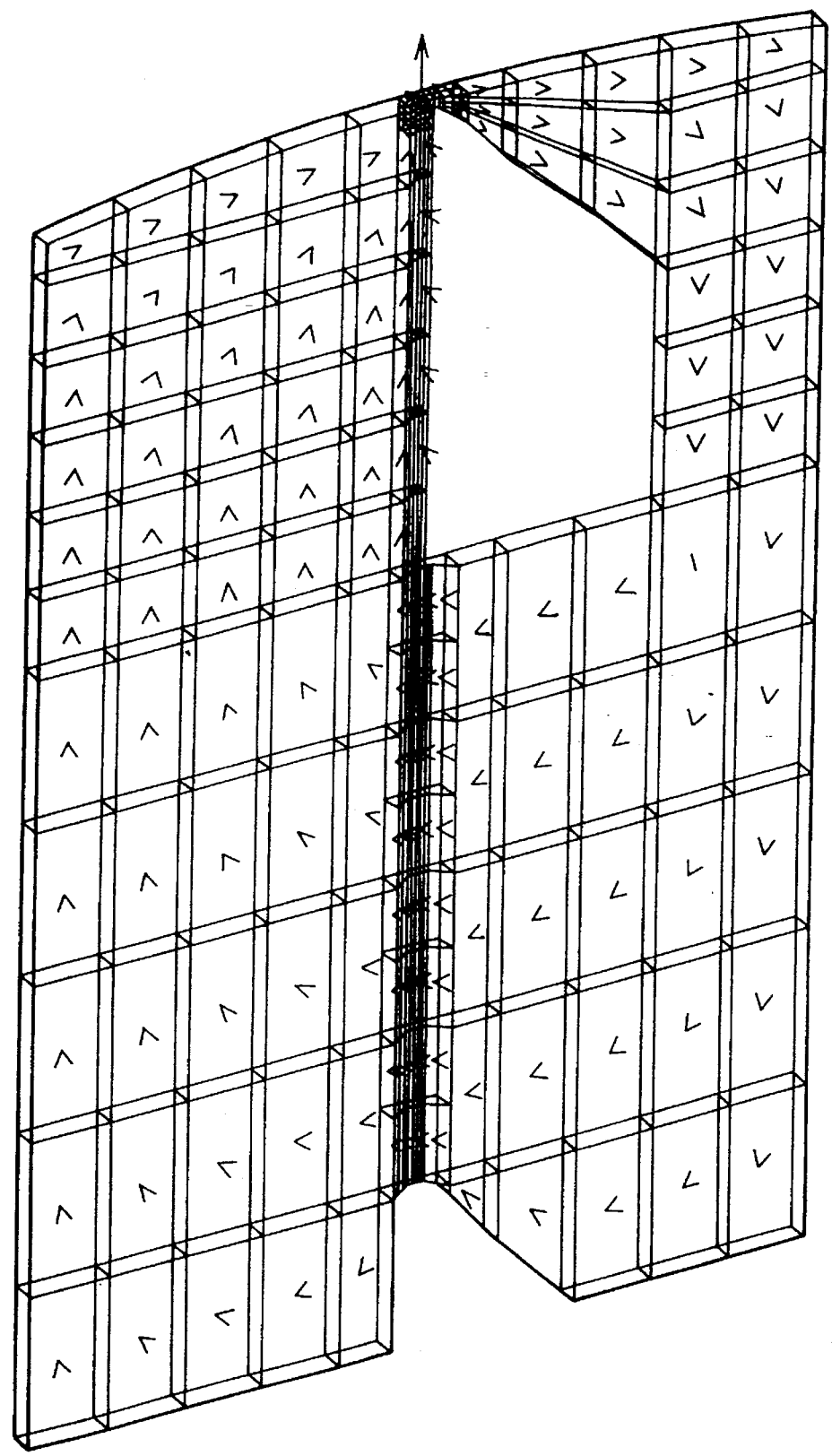
FIG. 7 is a view showing an example of a split figure for a magnetic device and a target area of analysis in the first embodiment of this invention.

As shown in FIG. 1, the data input part 1 is provided with data related to the characteristics of substances composing a magnetic device, data related to the structure of the magnetic device, data concerning the boundary conditions for analysis of structure, and data concerning the boundary conditions for analysis of magnetic field (conditions for magnetic field supply). The characteristics of substances can be divided into mechanical characteristics and magnetic characteristics. The mechanical characteristics include a Young's modulus, a thermal expansion coefficient, and a Poisson' ratio of each composite material. The magnetic characteristics include saturation magnetization, a magnetostriction constant, a domain wall mass, a damping-constant of a domain wall, recovering force of the domain wall, a gyro magnetic constant, a damping frequency of magnetization rotation, crystal magnetic energy, a curve of magnetic flux density—magnetic field strength at a specific azimuth, and initial permeability at a specific azimuth of each material, and at least one of these characteristics is input. In addition, a curve of magnetic flux density—magnetic field strength at a specific azimuth or initial permeability and the like under stressed condition may be input. The magnetic device and the target area for analysis are first divided into two areas and more, and the form is input as nodal points and elements. The boundary conditions for analysis of structure comprise, for example, load received at each element or nodal point, stress, and stress caused by thermal distortion, and at least one of them is input. The boundary conditions for analysis of magnetic field are (1) to cause magnetic field through electric current, and (2) to input a magnetic field, magnetization, or a magnetic potential directly. The split figures of the stress analysis part and the matrix analysis part may be different. In that case, an interpolation method can be applied to the distribution of the stress obtained from a stress analysis part 4 in order to obtain values of each nodal point and each element in the matrix forming part 5. FIG. 7 shows an example of the split figure.

The coupled analysis part 2 consists of the stress analysis part 4, the matrix forming part 5, a solving part 6, and a convergence judgement part 7. In the stress analysis part 4, analysis values of the stress distribution are obtained with the use of a finite element method, a boundary element method, or a difference method etc. and based on the data input from the date input part 1, with at least one boundary condition selected from the group consisting of a thermal stress distribution, an initial stress distribution, and load stress within the magnetic device, or the arithmetic sum of the aforementioned elements, or displacement of the magnetic device etc.

In the matrix forming part 5, one formula for obtaining the flow of the magnetic flux density of each element is solved in combination with at least one formula selected from the equations 1 to 4 for obtaining the flow of the magnetic flux density of the entire magnetic device. By solving the equations 1 to 4, the solution can be obtained, in which energy in the space where the magnetic device is present reaches the minimum. The equation 3 is a formula which shows the continuity of magnetic flux. The analysis of magnetic characteristics in the magnetic device can be conducted by constructing formulas for each element by using at least one method selected from the group consisting of a magnetoresistive method, a finite element method, a boundary element method, a finite difference method, a boundary integral method, an integral equation method, a surface charge method, a charge simulation method, and a magnetic moment method.

In the high frequency area of over 1 MHz, magnetic phenomena can be explained by the dynamic movement of an electron spin. The flow of magnetic flux within a magnetic body can be explained mainly by magnetization rotation. Frequency dependency of a magnetic moment at the time when the movement of the spin conducting precession is obstructed by a relaxation mechanism is know as Landau-Lifshitz equation and is shown as the equation 6 (Reference: Physics of Ferromagnetic Body, Author: Soushin Chikakado, Publisher: Shoukabou, 1984).

$$\frac{d^2\theta}{dt^2} + 4\pi\lambda\frac{d\theta}{dt} + \frac{\gamma^2}{\mu_0}\frac{dE}{d\theta} = 0 \quad \text{(equation 6)}$$

Figure 14:
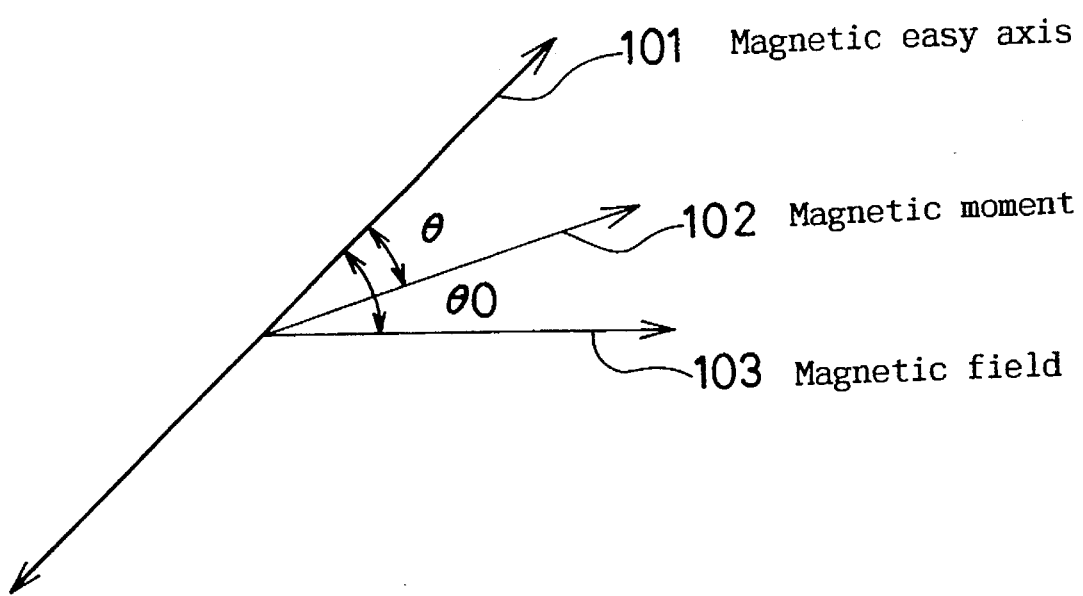
FIG. 14 is a view showing the relationship between the magnetic moment and the magnetic field in the first embodiment of this invention.

In the above-noted equation, $\theta$ represents a direction of the spin shown in FIG. 14, $\gamma$ represents a gyro magnetic constant, $\eta_0 = 4\pi \times 10^{-7}$. $\lambda$ represents a damping frequency, and t represents time. The internal energy E is shown in the equation 7 as the sum of crystal magnetic energy, magnetostriction energy, and energy by the effective magnetic field $H_{eff}$.

$$E = K_l(a_1^2 a_2^2 + a_2^2 a_3^2 + a_3^2 a_1^2) + \quad \text{(equation 7)}$$

$$\Sigma\left(\frac{3}{2}\lambda_{100}\sigma_i\left(a_1^2\gamma_{1i}^2 + a_2^2\gamma_{2i}^2 + a_3^2\gamma_{3i}^2 - \frac{1}{3}\right)\ i=x,y,z - \right.$$

$$3\lambda_{111}(a_1 a_2\gamma_{1i}\gamma_{2i} + a_2 a_3\gamma_{2i}\gamma_{3i} + a_3 a_1\gamma_{3i}\gamma_{1i}) - I_s \times H_{eff} \times \cos(\theta - \theta_0)$$

In the above-noted equation, $K_1$ represents crystal magnetic energy, $H_{eff}$ represents a sum of an external magnetic field $H_0$ and a demagnetization field $H_d$, $\lambda_{100}$ represents a magnetostriction constant at (100) direction, $\lambda_{111}$ represents a magnetic constant at (111) direction, $\sigma$ represents stress at i direction, $I_s$ represents saturation magnetization, i represents x, y, and $\alpha_j$ represents a direction cosine formed between the magnetic field with the azimuth shown in FIG. 14 and the crystal orientation, and $\gamma_{ji}$ represents a direction cosine of stress at i direction.

By solving the equation 6, the magnetization mode within the magnetic body can be described. For example, when an external magnetic field is determined as an alternating current magnetic field shown as $H_0 = H_1 e^{j\omega t}$, magnetic flux $\phi$ ($\omega$) within a microelement can be described as the equation 8.

$$\phi(\omega) = \frac{\gamma^2}{\mu_0} \cdot \frac{I_s \cdot H_1 \cdot \sin\theta}{(\omega_0^2 - \omega^2)} ((\omega_0^2 - \omega^2) - 4\pi\lambda\omega j) \quad \text{(equation 8)}$$

In the above-noted equation, $H_1$ represents a strength of the magnetic field of external alternating current, j represents an imaginary number, $\omega$ represents an angular velocity calculated by $4\pi \times$ frequency, and $\omega_0$ represents a value shown as the equation 9.

$$\omega_0^2 = \frac{\gamma^2}{\mu_0}\left(\frac{d^2E}{d\theta_{min}^2}\right) \quad \text{(equation 9)}$$

For obtaining a magnetic flux density of each element, a domain wall motion may be added to the equation 6. For example, the equation of motion with 180 degrees domain wall is shown as the equation 10 (Reference: Physics of Ferromagnetic Body, Author: Soushin Chikakado, Publisher: Shoukabou, 1984).

$$m\frac{d^2s}{dt^2} + \beta_{100}\frac{ds}{dt} + as = 2I_s \times H_{eff} \quad \text{(equation 10)}$$

In the above-noted equation, m represents a mass of a domain wall per unit area, $\beta_{180}$ represents a damping coefficient of the domain wall, s represents energy of the domain wall, and $\alpha$ represents a recovering force of the domain wall.

A formula for obtaining the flow of magnetic density in the entire magnetic device can be described by using the finite element method, in which B is a magnetic flux density and A, a magnetic vector potential defined as the equation 11, is determined as an unknown quantity.

$$B = \text{rot } A \quad \text{(equation 11)}$$

The finite element method is used for solving, so that the formula of a magnetic field obtained by substituting the equation 11 with the Maxwell's equations also holds good for the entire magnetic device. Furthermore, the magnetic vector potential was used as an unknown quantity in this embodiment, but it is also possible to use unknown variables, for example, a magnetic vector potential and an electric scalar potential, a magnetic scalar potential, a magnetic scalar potential and an electric vector potential, a magnetic field strength and a magnetic scalar potential, a magnetic vector potential and an electric scalar potential and a magnetic scalar potential, a magnetic vector potential and a magnetic scalar potential, a field strength and a magnetic scalar potential, a magnetic field strength, a magnetic flux density etc. Besides the finite element method, by using at least one method selected from the group consisting of a magnetoresistive method, a boundary element method, a finite difference method, a boundary integral method, an integral equation method, a surface charge method, a charge simulation method, a magnetic moment method and the like, the formula of a magnetic field can be solved as formula of each element.

By solving the equations simultaneously in combination, instability of the solution caused by having a non-linear part or divergence of the solution can be avoided, so that the convergence solution can be obtained stably. As for each element k, when it is $A_k (\theta_k, H_k)=0$ in the equations 1 to 4 and when the solutions of the equations 6 and 10 are shown as $\phi_k (\theta_k, H_k)=0$, $\theta_k$, $H_k$ which satisfy the both can be obtained in the following equation.

$$\begin{vmatrix} \dfrac{\delta A_k}{\delta \theta} & \dfrac{\delta A_k}{\delta H} \\ \dfrac{\delta \phi_k}{\delta \theta} & \dfrac{\delta \phi_k}{\delta H} \end{vmatrix} \begin{vmatrix} \Delta \theta_k \\ \Delta H_k \end{vmatrix} = \begin{vmatrix} -A_k \\ -\phi_k \end{vmatrix} \quad \text{(equation 12)}$$

Figure 6:
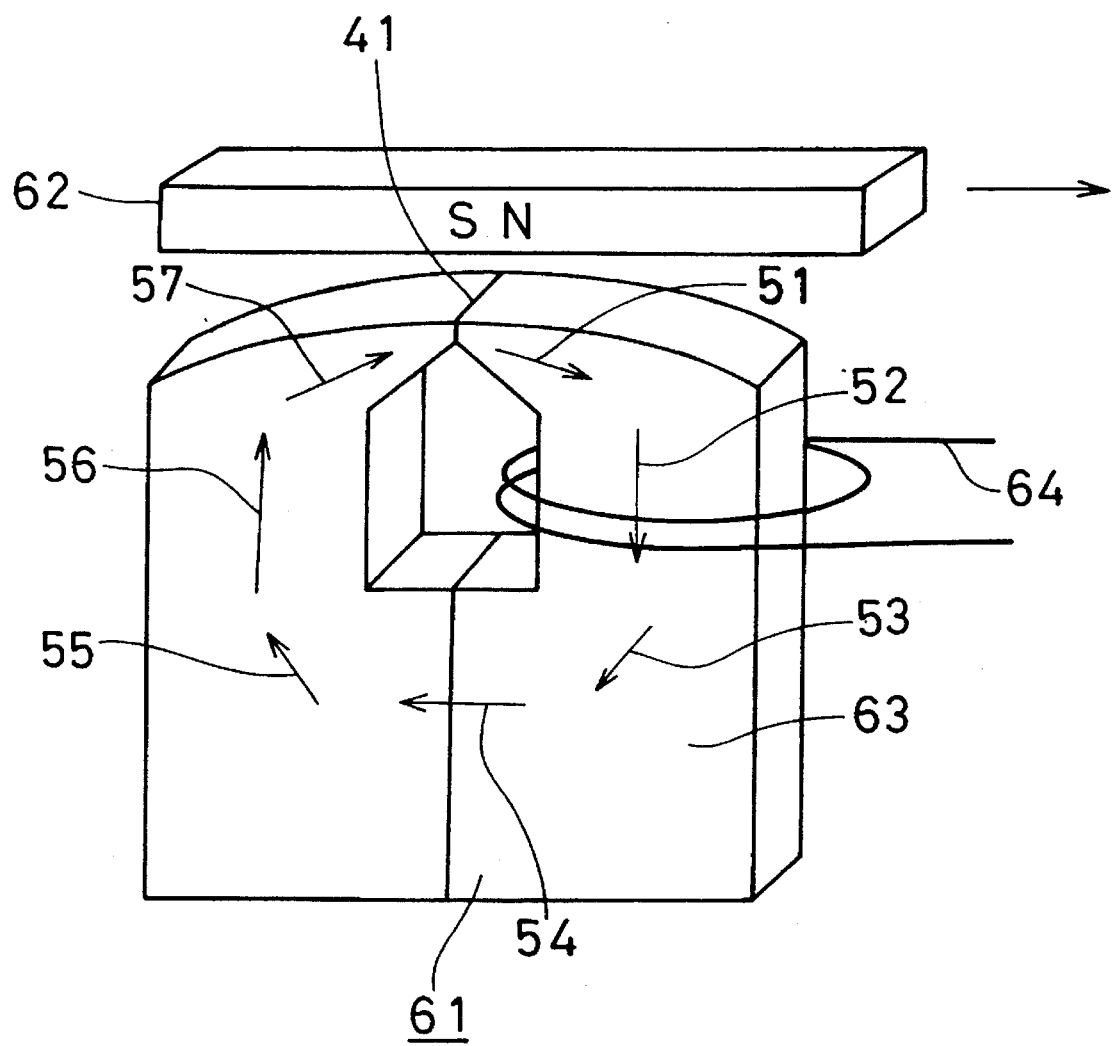
FIG. 6 is a schematic view showing directions of magnetic moments within a magnetic head in the process of recording and reproducing in the first embodiment of this invention.

The solving part 6 is a part, where a group of equations combined by Gauss elimination and an ICCG method etc. is solved, and the convergence condition of the solution is judged in the convergence judgement part 7, and when convergence took place, the solution is then output at the result output part 3. Recording characteristics of the magnetic head can be obtained by providing electric current into a coil 64 of FIG. 6 which forms an interlinkage with a part 52 of a magnetic head 61, and by calculating leakage flux occurring from a magnetic gap 41. Furthermore, reproducing characteristics of the magnetic head can be obtained by disposing a magnet to a magnetic tape 62 disposed on top of the magnetic gap 41, and by calculating the amount of magnetic flux at the magnetic flux moment 52 which flows inside the magnetic head 61 caused by the generated magnetic field. In addition, by the movement of the magnet, the amount of electric current induced in the coil 64 may be calculated as well.

The result output part 3 is a part where the data obtained by the coupled analysis part 2, for example, a distribution of magnetic flux density, a distribution of magnetic moment, a graph showing lines of magnetic flux, an equipotential line, a distribution of magnetic field strength, and recording characteristics and reproducing characteristics in the magnetic head are output, and this part comprises a printer, a cathode ray tube (CRT), a plotter and the like.

Figure 13:
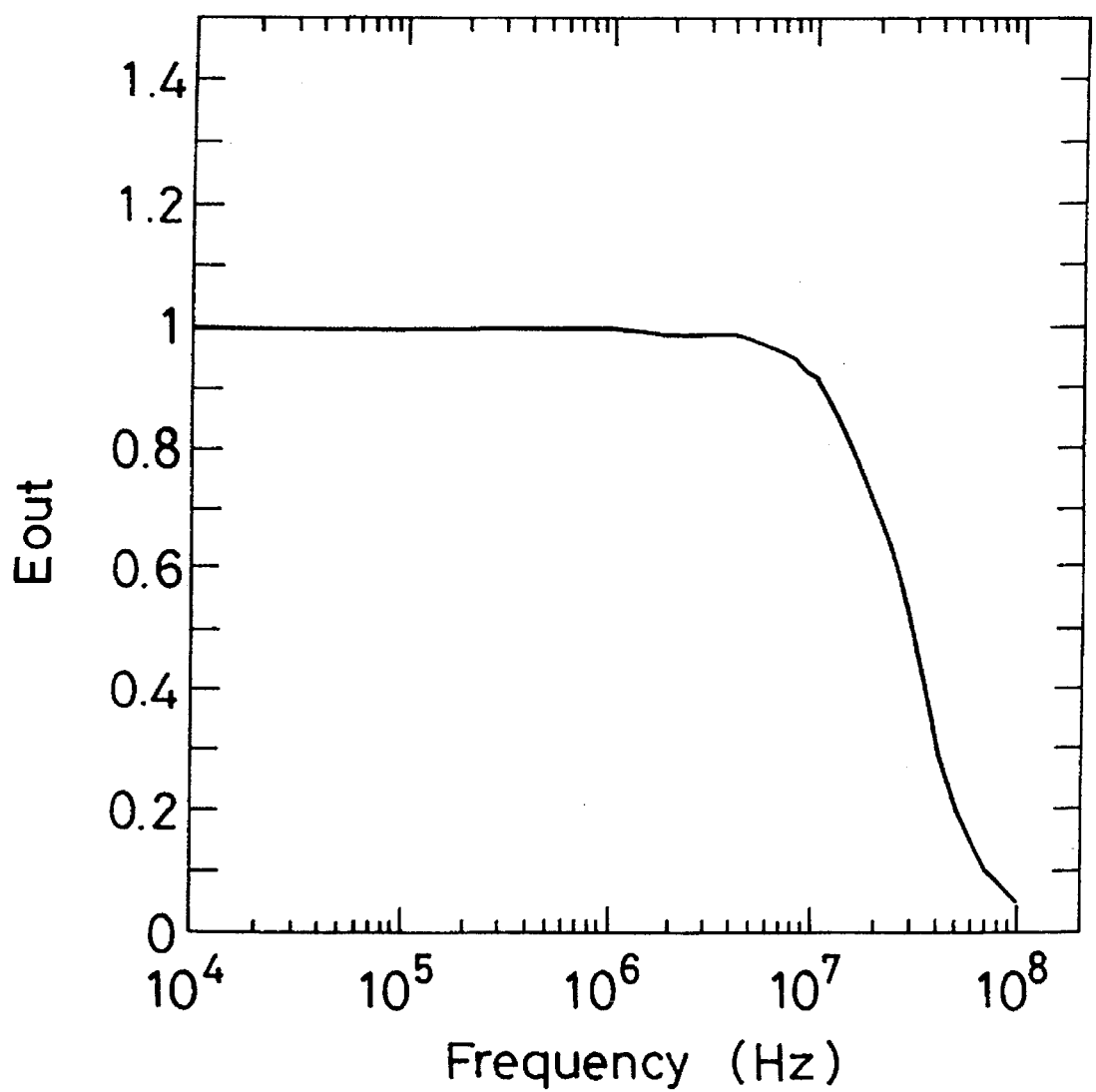
FIG. 13 is a graph showing an example of frequency dependency of the reproduced output in a magnetic head obtained in the first embodiment of this invention.

An example of frequency dependency of the reproducing output of the magnetic head obtained in the above-mentioned way is shown in FIG. 13. It is preferable that the reproducing characteristics of the magnetic head show a high absolute output value and extend up to a high output frequency.

EXAMPLE 2

Figure 2:
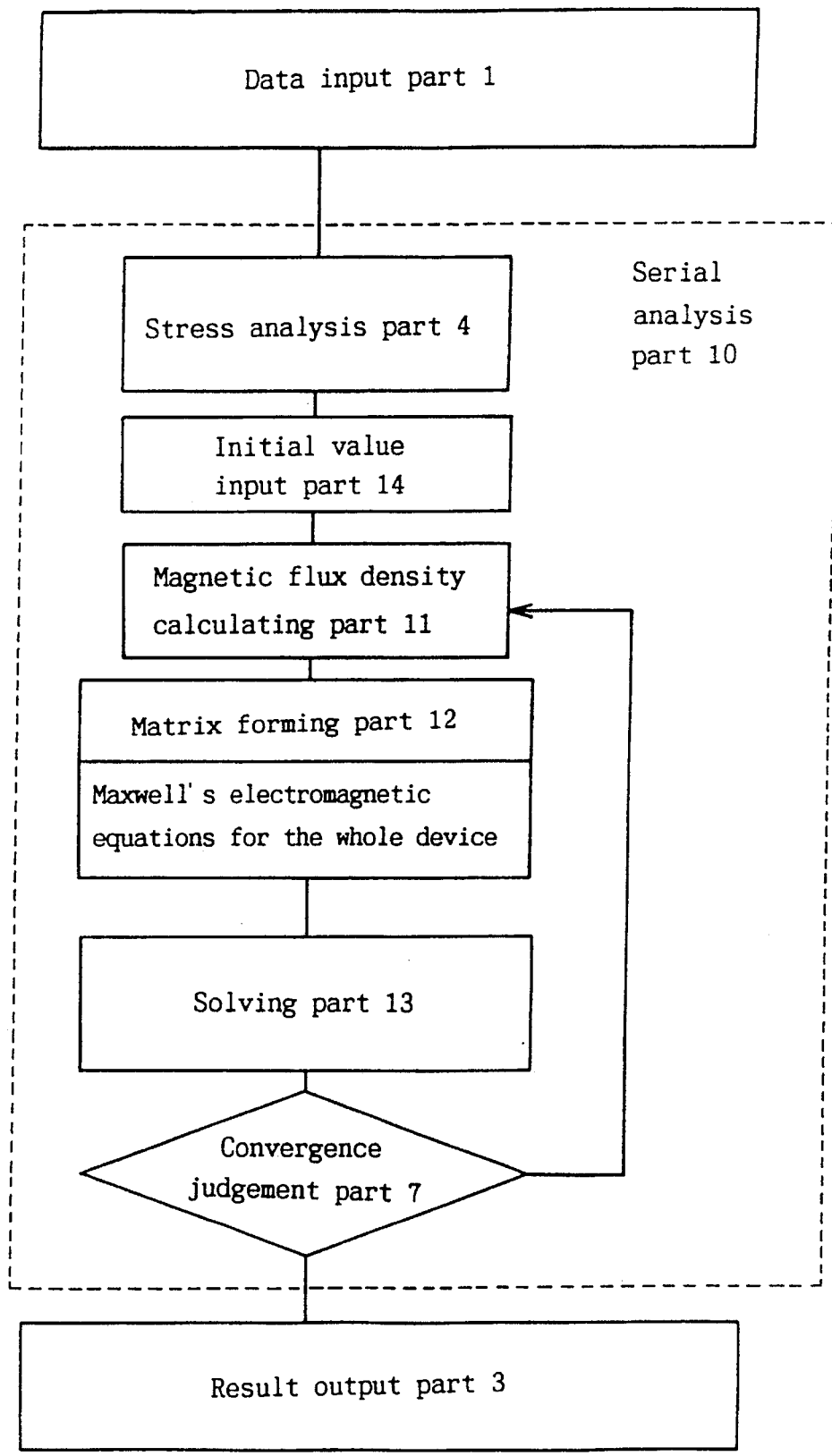
FIG. 2 is a flow chart showing a second embodiment of a method for analysis of magnetic recording characteristics of this invention.

FIG. 2 is a flow chart showing a second embodiment of a method for analysis of magnetic recording characteristics of this invention. An apparatus for analysis of magnetic recoding characteristics of this invention comprises a data input part 1, a serial analysis part 10 which conducts the analysis of the flow of magnetic flux density in each element and the analysis of magnetic characteristics in the entire magnetic device alternately, and a result output part 3.

As shown in FIG. 2, various data are input to the data input part 1, as in the first embodiment.

The serial analysis part 10 comprises a stress analysis part 4, an initial value input part 14, a magnetic flux density calculating part 11, a matrix forming part 12, a solving part 13, and a convergence judgement part 7. First, in the stress analysis part 4, a stress distribution within the magnetic device is obtained based on the data input from the data input part 1, as in the first embodiment. In the initial value input part 14, an initial value of the effective magnetic field $H_{eff}$ is determined. Then, in the magnetic flux density calculating part 11, a magnetic field dependent curve of magnetic flux density for each element can be calculated by using the equations 6 and 10. Next, in the matrix forming part 12, magnetic characteristics of the entire magnetic device are described with the equations 1 to 4, and formulas for each element are formed by means of a method selected from the group consisting of a magnetoresistive method, a finite element method, a boundary element method, a finite difference method, a boundary integral method, an integral equation method, a surface charge method, a charge simulation method, a magnetic moment method. Thereafter, in the solving part 13, a magnetic flux density and a magnetic field distribution of each element can be obtained. By using the magnetic field distribution obtained in this way, the magnetic flux density of each element is obtained in a magnetic flux density calculating part 11, and the magnetic characteristics of the whole magnetic device are obtained in the matrix forming part 12. The convergence conditions of the solutions obtained by alternately calculating in the magnetic flux density calculating part 11 and in the matrix forming part 12 are judged, and when convergence took place, the convergence solutions are forwarded to the result output part 3.

In order to conduct a three-dimensional analysis of magnetic solutions, the number of elements will be extremely large, so that a large-scale calculation will be necessary. When the calculation formulas of the magnetic flux density and the Maxwell's equations for the entire magnetic device are solved separately, the scale of the matrix can be reduced. In this way, the present calculators can be used effectively, and it is therefore possible to calculate in a practical time.

EXAMPLE 3

Figure 3:
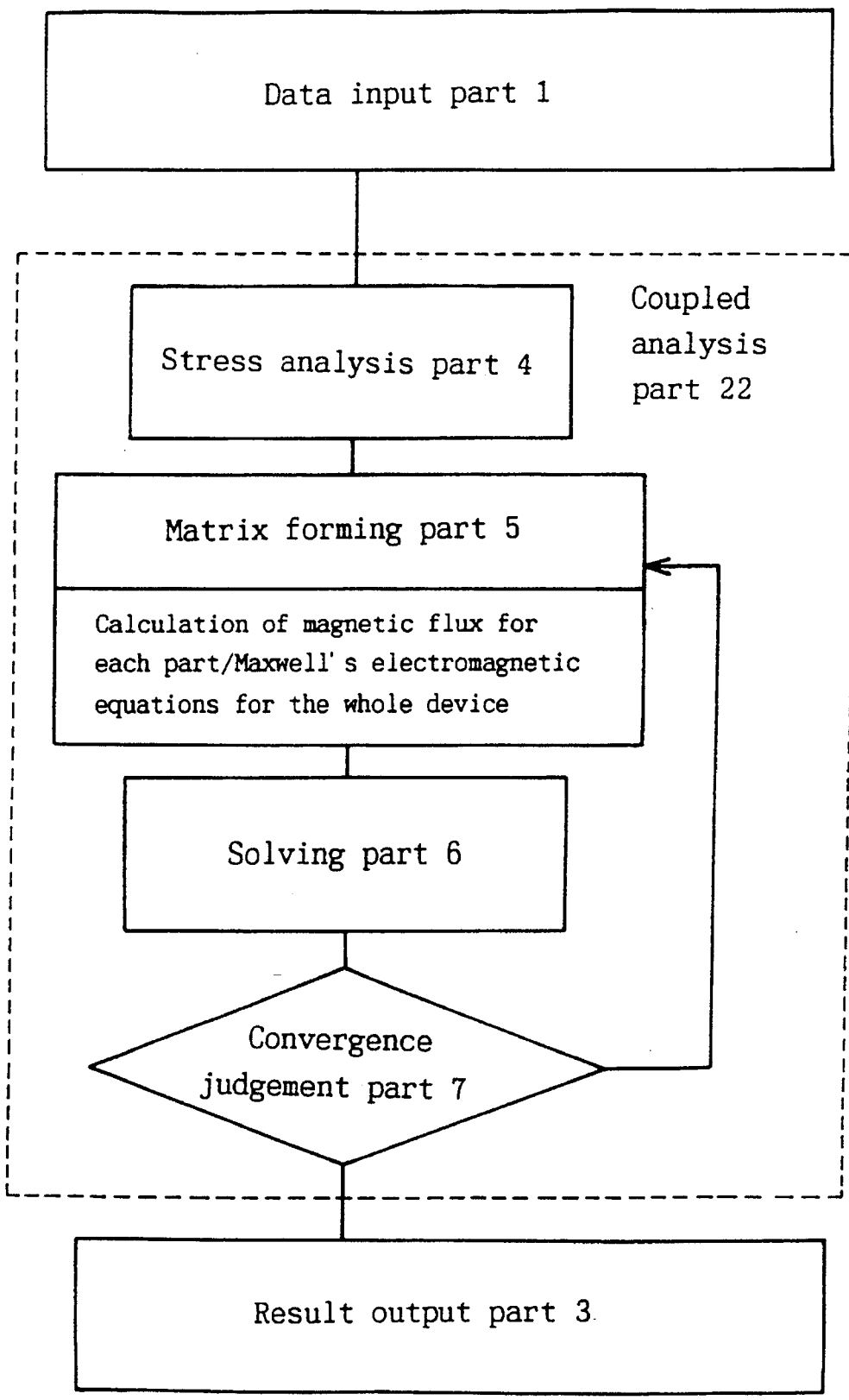
FIG. 3 is a flow chart showing a third embodiment of a method for analysis of magnetic recording characteristics of this invention.

FIG. 3 is a flow chart showing a third embodiment of a method for analysis of magnetic recording characteristics of this invention. An apparatus for analysis of magnetic recording characteristics of this invention comprises a data input part 1, a coupled analysis part 22 which conducts the analysis for obtaining the initial permeability of each element and the analysis of magnetic characteristics in the entire magnetic device in combination, and a result output part 3.

As shown in FIG. 3, various data are input to the data input part 1, as in the first embodiment.

The coupled analysis part 22 comprises a stress analysis part 4, a matrix forming part 25, a solving part 6, and a convergence judgement part 7. First, in the stress analysis part 4, stress within each element is obtained based on the boundary conditions input from the data input part 1, and at the same time, the initial permeability of each element is obtained from at least one of the equations 6 or 10, and and then combined with Maxwell's equations for the entire magnetic device. Then, solutions are obtained in the solving part 6, which are forwarded to the result output part 3.

Assumed that the form is flat and the magnetization rotates within the plane as with a magnetic head, and when the equation 6 is solved under this assumption, the initial permeability due to a rotational magnetization can be shown as the equation 13 below.

$$\mu_{rot}(\omega) = \dfrac{\gamma^2 I_s^2 (\omega_0^2 - \omega^2)}{\mu_0(\omega_0^2 - \omega^2) + (4\pi \beta_{rot}\omega)} \sin^2\theta \quad \text{(equation 13)}$$

In the above-noted equation, $\beta_{rot}$ represents a damping constant of a rotational magnetization.

Furthermore, by solving the equation 10, the initial permeability due to a domain wall motion can be shown as the equation 14.

$$\mu_{180}(\omega) = \frac{2I_s^2(\pi^2\lambda_{100}\sigma \cdot n - m\omega^2)n}{\mu_0((\pi^2\lambda_{100}\sigma \cdot n - m\omega^2) + \beta_{180}\omega^2)} \quad \text{(equation 14)}$$

In the above-noted equation, $\sigma$ represents stress at a principal axis direction, n represents a number of domain walls contained per unit volume, and initial permeability $\mu$ of the system is shown as the equation 15.

$$\mu(\omega) = \mu_{rot} + \mu_{180} \quad \text{(equation 15)}$$

Figure 8:
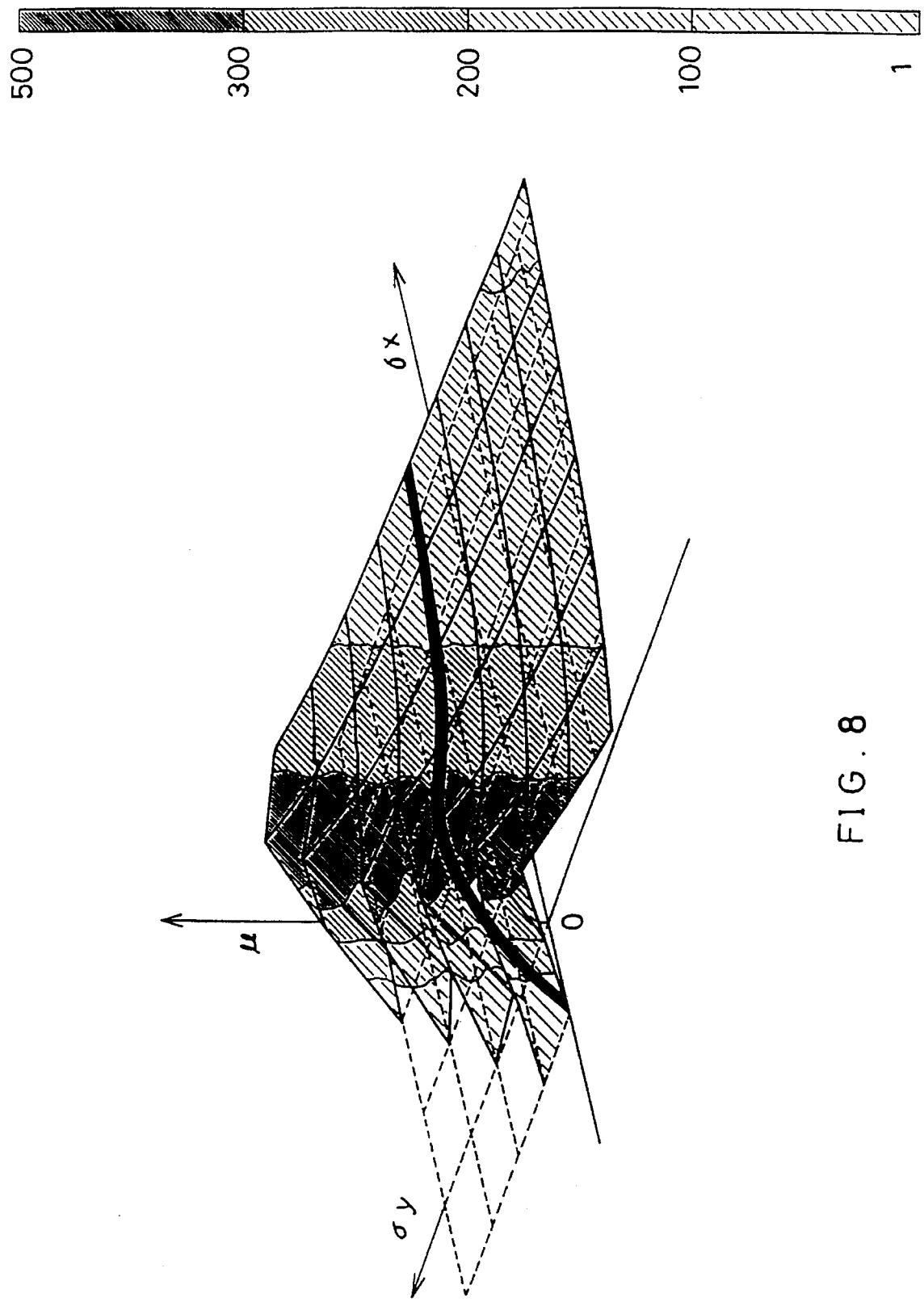
FIG. 8 is a view showing stress$\sigma_x$ at x direction of initial permeability at x direction and dependency of stress$\sigma_y$ at y direction.
Figure 12:
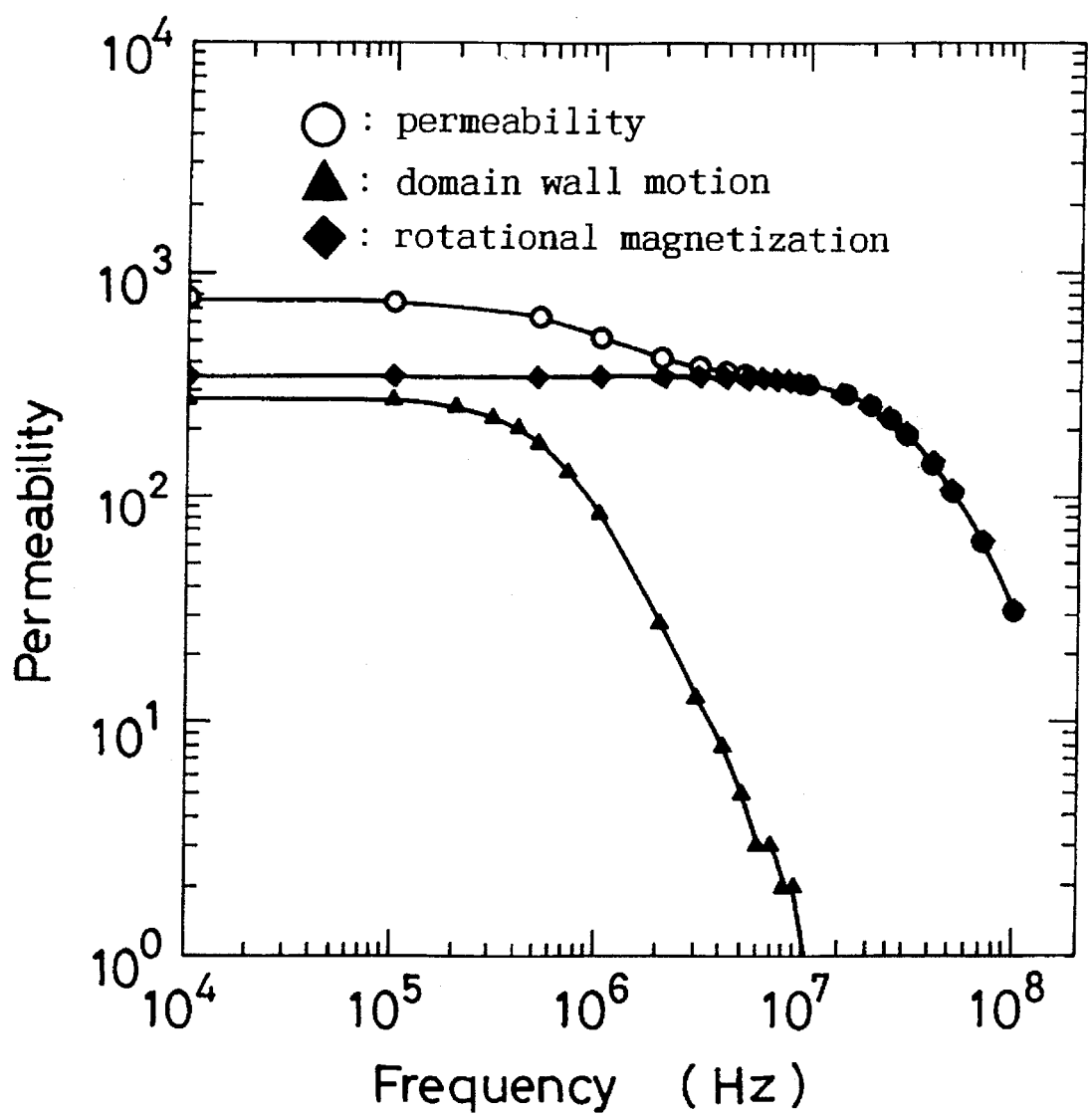
FIG. 12 is a graph showing frequency dependency of initial permeability of a magnetic head obtained in the third embodiment of this invention.

FIG. 8 shows the stress $\sigma_x$ at x direction of the initial permeability at the x direction and the dependency of stress $\sigma_y$ at y direction obtained in the above-noted way with 10 MHz. An example of calculating frequency dependency of the initial permeability is shown in FIG. 12. In FIG. 12, a mark ○ indicates whole initial permeability $\mu$, a mark ● indicates initial permeability $\mu_{rot}$ due to rotational magnetization, and a mark ▲ indicates initial permeability $\mu_{180}$ due to a domain wall motion.

For example, the initial permeability can be described with a rotational magnetization moment only in a sufficiently low frequency area, and when the sliding direction is determined as (110) plane and the gap depth direction as (100) plane, the equation 15 can be described in the simplified formula as shown below.

$$\mu = \frac{1}{\mu_0} \frac{I_s^2}{-3\lambda_{100}\sigma_x + \frac{3\sigma_y(\lambda_{100} - \lambda_{111})}{2} + \frac{3\sigma_z(\lambda_{100} - \lambda_{111})}{2} + K_1 + \frac{K_2}{2}} \quad \text{(equation 16)}$$

In the above-noted equation, $K_1$ and $K_2$ represent crystal magnetic energy, $\sigma_x$, $\sigma_y$, and $\sigma_z$ respectively represents stress at sliding direction, stress at width direction, and stress at gap depth direction.

EXAMPLE 4

Figure 4:
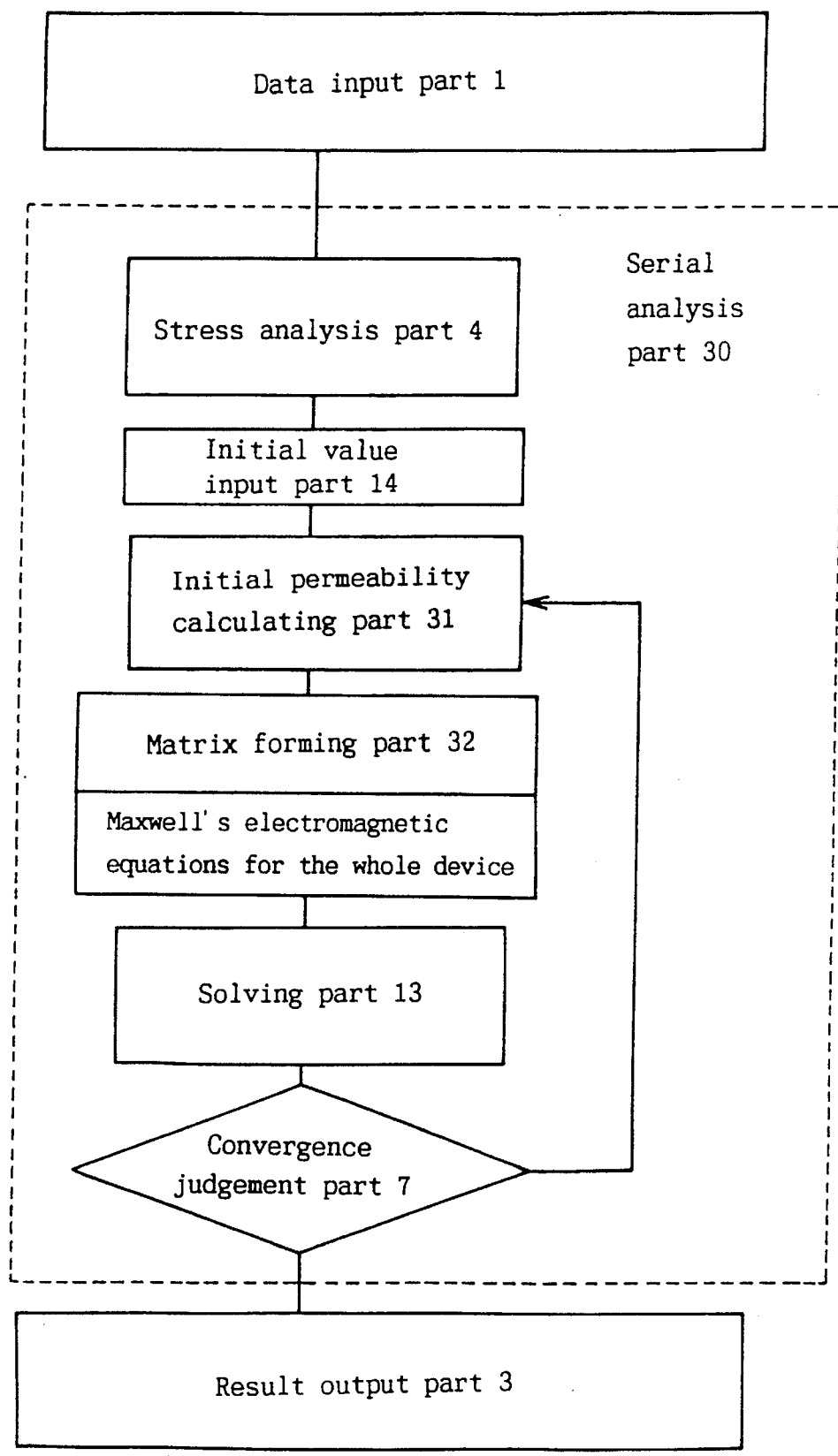
FIG. 4 is a flow chart showing a fourth embodiment of a method for analysis of magnetic recording characteristics of this invention.

FIG. 4 is a flow chart showing a fourth embodiment of a method for analysis of magnetic recording characteristics of this invention. An apparatus for analysis of magnetic recording characteristics of this invention comprises a data input part 1, a serial analysis part 30 which alternately conducts calculation of initial permeability of each element and formation of matrix for the entire magnetic device, and a result output part 3.

As shown in FIG. 4, various data are input to the data input part 1, as in the first embodiment.

The serial analysis part 30 comprises a stress analysis part 4, an initial value input part 14, initial permeability calculating part 31, a matrix forming part 32, a solving part 13, and a convergence judgement part 7. First, in the stress analysis part 4, a stress distribution within the magnetic device is obtained based on the boundary conditions input from the data input part 1. Next, in the initial value input part 14, an initial value of the effective magnetic field $H_{eff}$ is determined. Then, in the initial permeability calculating part 31, initial permeability of each element can be calculated by using the equations 13 and 15. Next, in the matrix forming part 32, magnetic characteristics of the entire magnetic device are described with the equations 1 to 4. Thereafter, by solving formulas for each element in the solving part 13 by means of at least one method selected from the group consisting of a magnetoresistive method, a finite element method, a boundary element method, a finite difference method, a boundary integral method, an integral equation method, a surface charge method, a charge simulation method, a magnetic moment method, a magnetic field distribution of each element can be obtained. By using the magnetic field distribution of solutions obtained in the above-noted way, the magnetic flux density of each element is obtained in initial permeability calculating part 31, and the magnetic characteristics for the whole magnetic device are obtained in the matrix forming part 12. The convergence conditions of the solutions obtained by alternately calculating in the initial permeability calculating part 31 and in the matrix forming part 12 are judged, and when convergence took place, the convergence solutions are forwarded to the result output part 3.

In the above-mentioned embodiment, the initial permeability or the curve of magnetic flux density—magnetic field was obtained by using the equation 6 and the equation 10, but it is not limited to this method only. For example, it is also possible to obtain the initial permeability or the curve of magnetic flux density—magnetic field by using an anticipated theoretical value and an experimental value and by conducting compensation with spline compensation and the like. Furthermore, these results can be formed as a table for reference. Also, a neuro-processing having learning function or a fuzzy calculation is also effective for obtaining the relationship between the stress and the initial permeability and the relationship between the stress and the curve of magnetic flux density—magnetic field.

As described above, magnetic characteristics of a magnetic head material change according to thermal stress and external force. Therefore, it is extremely effective from the viewpoint of designing a magnetic head to obtain the curve of magnetic flux density—magnetic field strength or the distribution of the initial permeability from stress distribution and to form such that each part has a higher curve of magnetic flux density—magnetic field strength than in the time of no stress. In this case, the high curve of magnetic flux density—magnetic field strength means that higher magnetic flux density is possessed with lower magnetic field strength.

Figure 9:
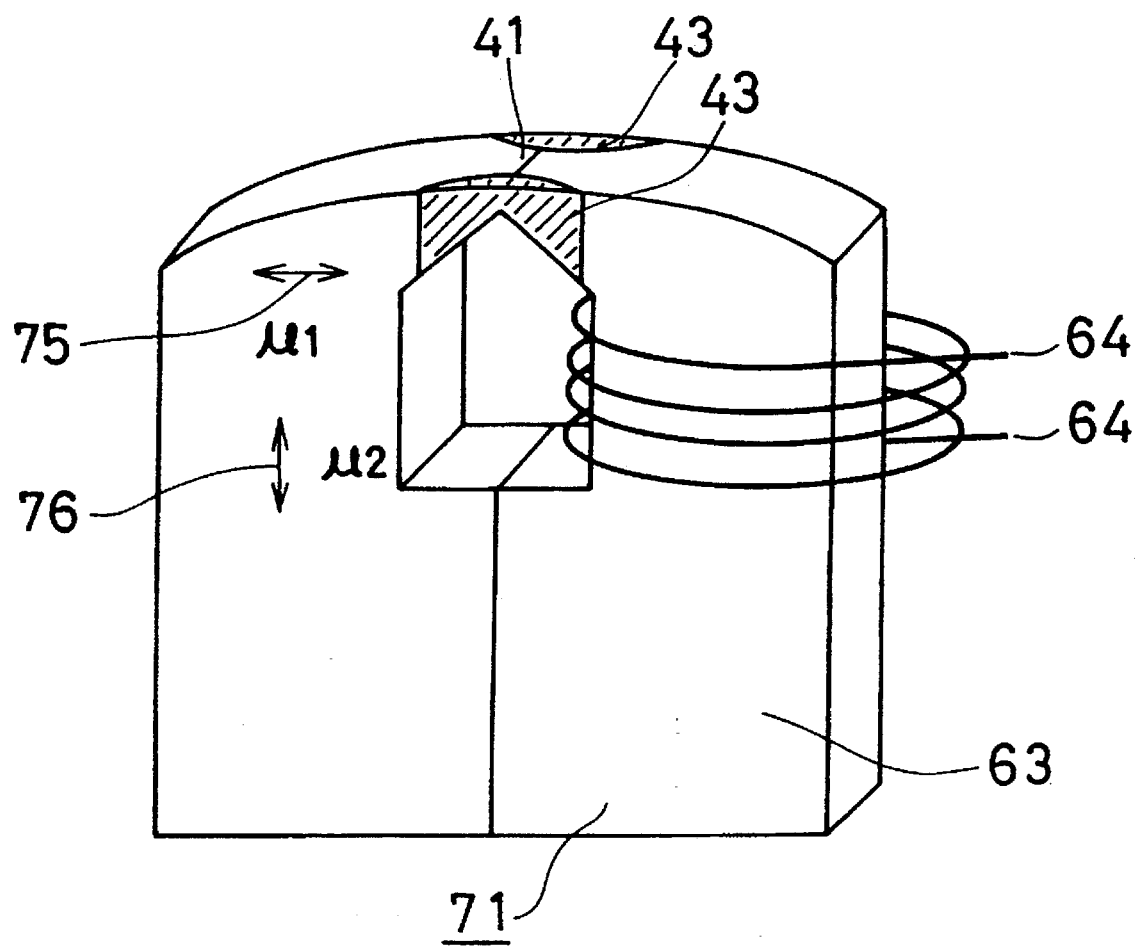
FIG. 9 is a perspective view showing a structure of a magnetic head in the fourth embodiment of this invention.

As shown in FIG. 9, the whole structure can be simplified and considered separately as a part 75 where a magnetic moment is oriented to the sliding direction and as a part 76 where a magnetic moment is oriented to the gap depth direction. In the magnetic head, by separately taking the curve of magnetic flux density—magnetic field strength at sliding direction of the tape of the material comprising the magnetic circuit and the curve of magnetic flux density—magnetic field strength at the gap depth direction into consideration, when the stress due to thermal stress and external stress is optimized, the curve of magnetic flux density—magnetic field strength can be formed higher than in the time of no stress both at sliding direction and at gap depth direction.

EXAMPLE 5

It is effective for the improvement of magnetic recording efficiency to impose stress on materials comprising a magnetic circuit by bonding substances having different thermal expansion coefficient with the material composing the head to one side or both sides of a ring type magnetic head, and to make the initial permeability to be higher than with the state without stress.

Figure 16:
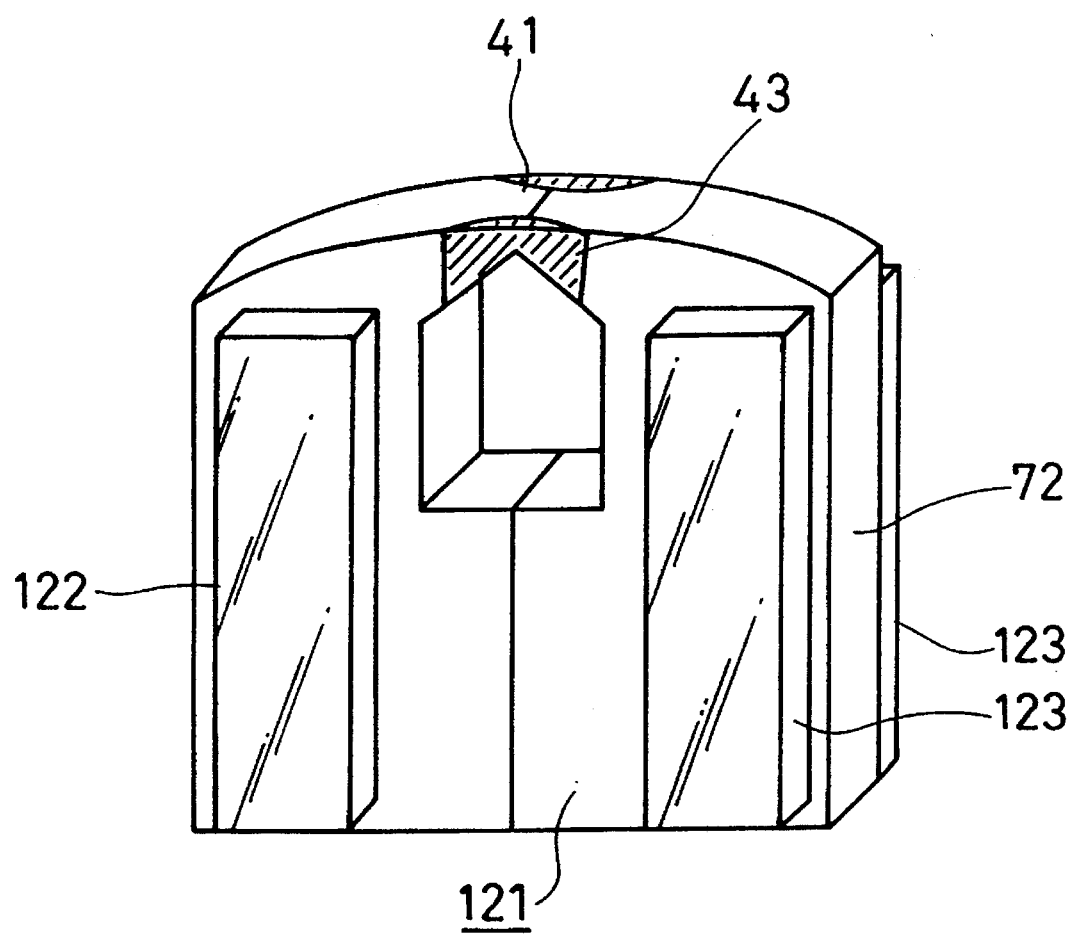
FIG. 16 is a perspective view showing an example of a structure of a magnetic head in a fifth embodiment of this invention.

FIG. 16 is a perspective view showing an embodiment of a magnetic head of this invention. As shown in FIG. 16, glass 122, 123 having a lower thermal expansion coefficient than ferrite are attached on the side surfaces of a ferrite head 121 having a negative magnetostriction constant. It is configured such that tensile stress 121 is imposed on the ferrite to enhance the initial permeability of the side surface at gap depth direction to be higher than the initial permeability in the time of no stress. Substances attached on the side surfaces of the ferrite head are not limited to glass. It is also possible to use ceramics and plastics etc. besides glass. Furthermore, it goes without saying that other magnetic materials besides ferrite such as a metal magnetic film can be used as well.

When the magnetostriciton constant of a magnetic material such as ferrite should be positive, the initial permeability of the side surface at gap depth direction can be enhanced to be higher than that in the time of no stress by using materials having larger thermal expansion coefficient than the magnetic material.

Figure 17:
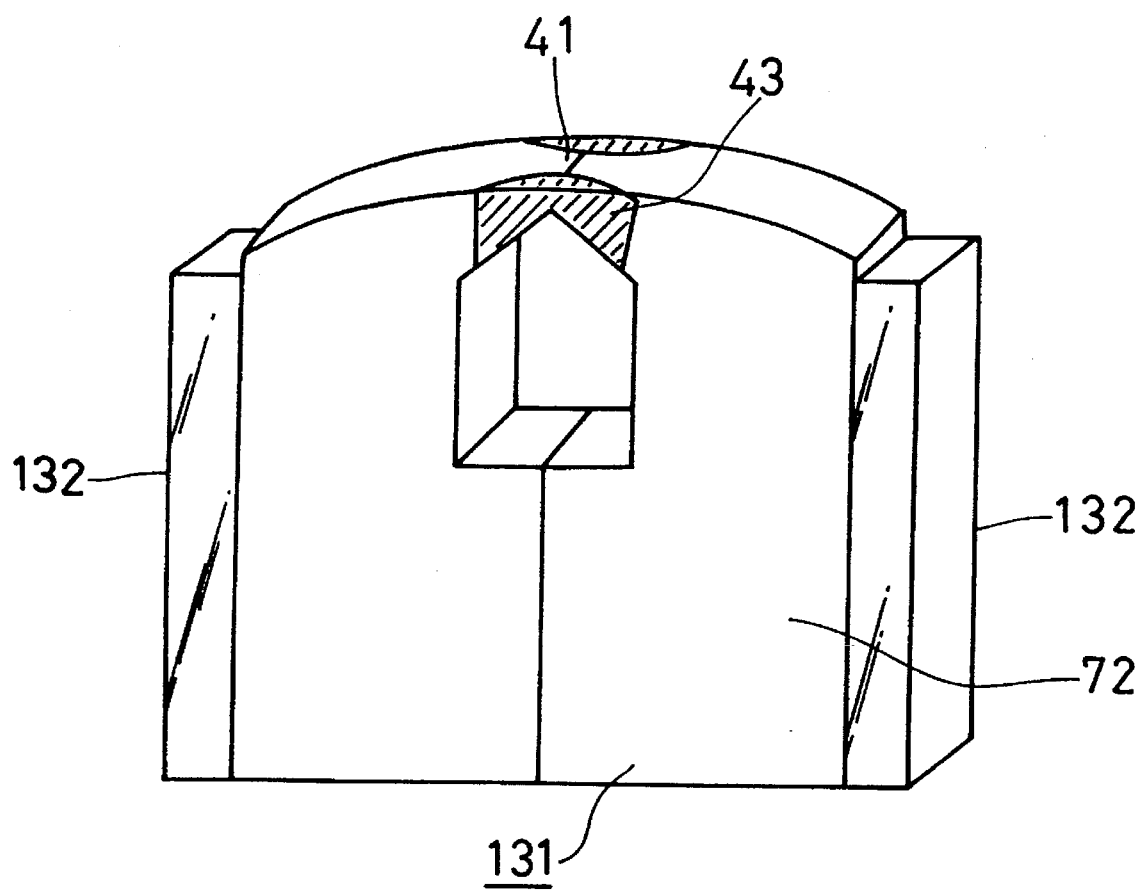
FIG. 17 is a perspective view showing an another example of a structure of a magnetic head in the fifth embodiment of this invention.

As shown in FIG. 16, non magnetic materials such as glass 122, 123 may be disposed on both sides or only on one side of a ring type magnetic head (ferrite head 121). Furthermore, as shown in FIG. 17, the non magnetic materials 132 such as glass may be disposed on the back sides of a ring type magnetic head 131. As for the combination and the form of these magnetic and non magnetic materials, it is effective to select the materials and to design the form most suitably with the use of the above-mentioned apparatus for analysis of magnetic recording characteristics 131.

EXAMPLE 6

The above-noted method of analysis is also applicable when the difference of thermal expansion coefficient and external force etc. of the material are small so there is almost no stress.

Figure 11:
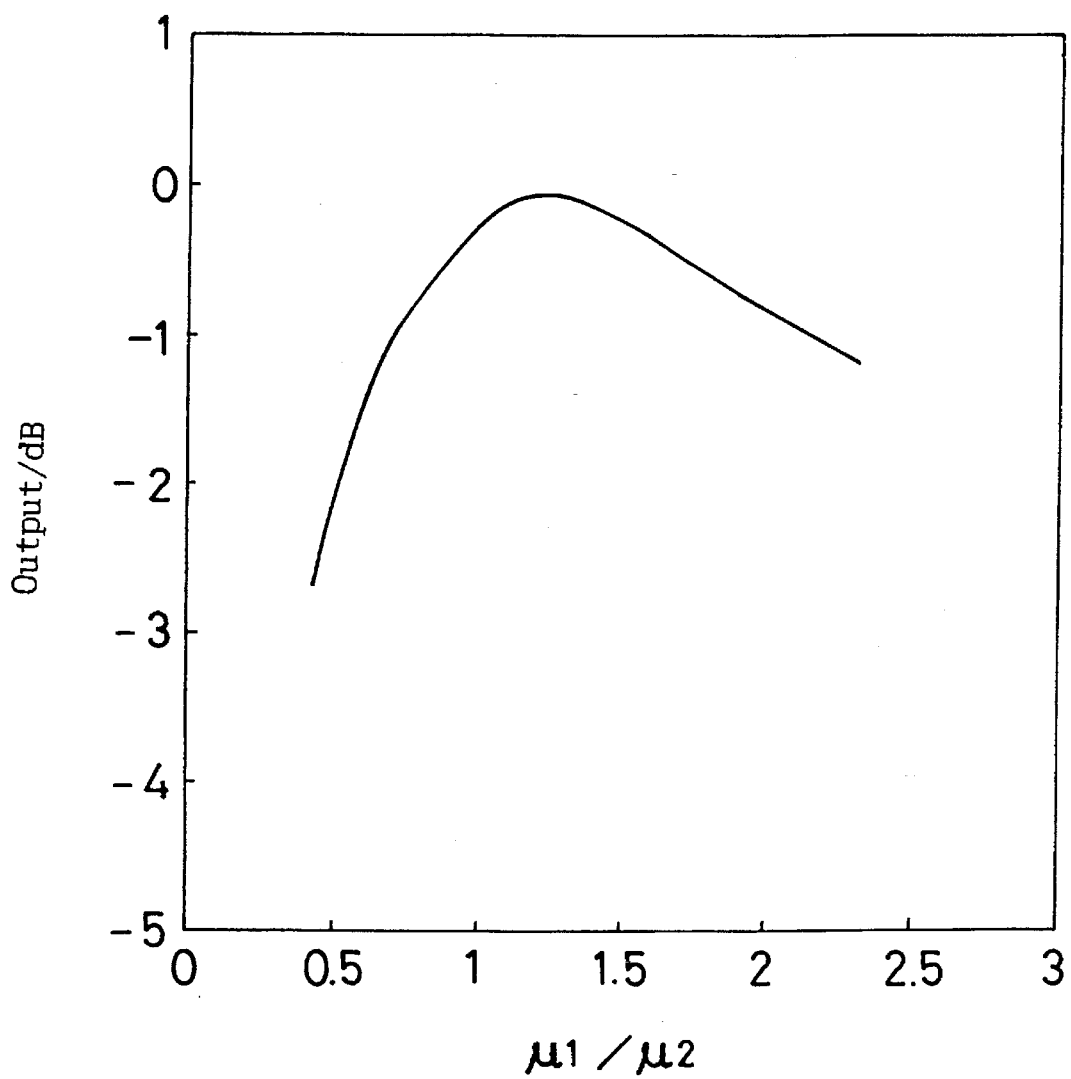
FIG. 11 is a graph showing the relationship between the anisotropy of initial permeability and the output of a magnetic head obtained in a sixth embodiment of this invention.

FIG. 11 shows the results of conducting an analysis of the recording and reproducing characteristics by using initial permeability $\mu_1$ at rubbing direction 75 and initial permeability $\mu_2$ at gap depth direction 76 shown in FIG. 9. As shown in FIG. 11, in a ring type magnetic head 71 which sends and receives signals with a magnetic medium, and when the permeability at the tape rubbing direction 75 of a magnetic material 63 comprising the magnetic circuit is determined as $\mu_1$ and the permeability at gap depth direction 76 is determined as $\mu_2$, then, it becomes clear that the output characteristics are satisfactory in the area where $\mu_1/\mu_2$ corresponds to the equation 17.

$$1.1 < \frac{\mu_1}{\mu_2} < 1.4 \qquad \text{(equation 17)}$$

Figure 15:
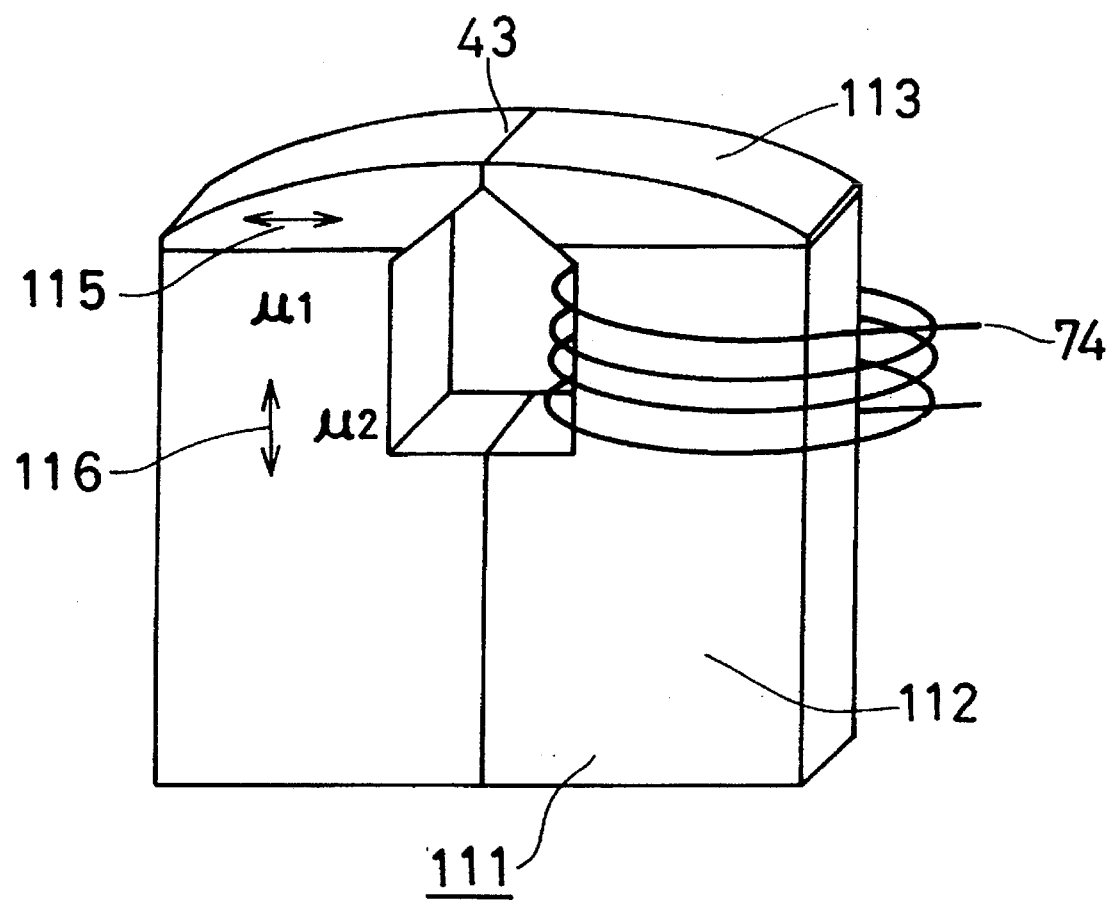
FIG. 15 is a perspective view showing an example of a structure of a magnetic head in the sixth embodiment of this invention.

As shown in FIG. 15, a bulk type magnetic head 111 is manufactured by using a single crystal ferrite, and when the permeability at rubbing side direction 115 is determined as $\mu_3$ and the permeability at gap depth direction 116 is determined as $\mu_4$, then, it becomes clear that it is satisfactory in the area where $\mu_3/\mu_4$ corresponds to the equation 18.

$$1.1 < \frac{\mu_3}{\mu_4} < 1.4 \qquad \text{(equation 18)}$$

Figure 10:
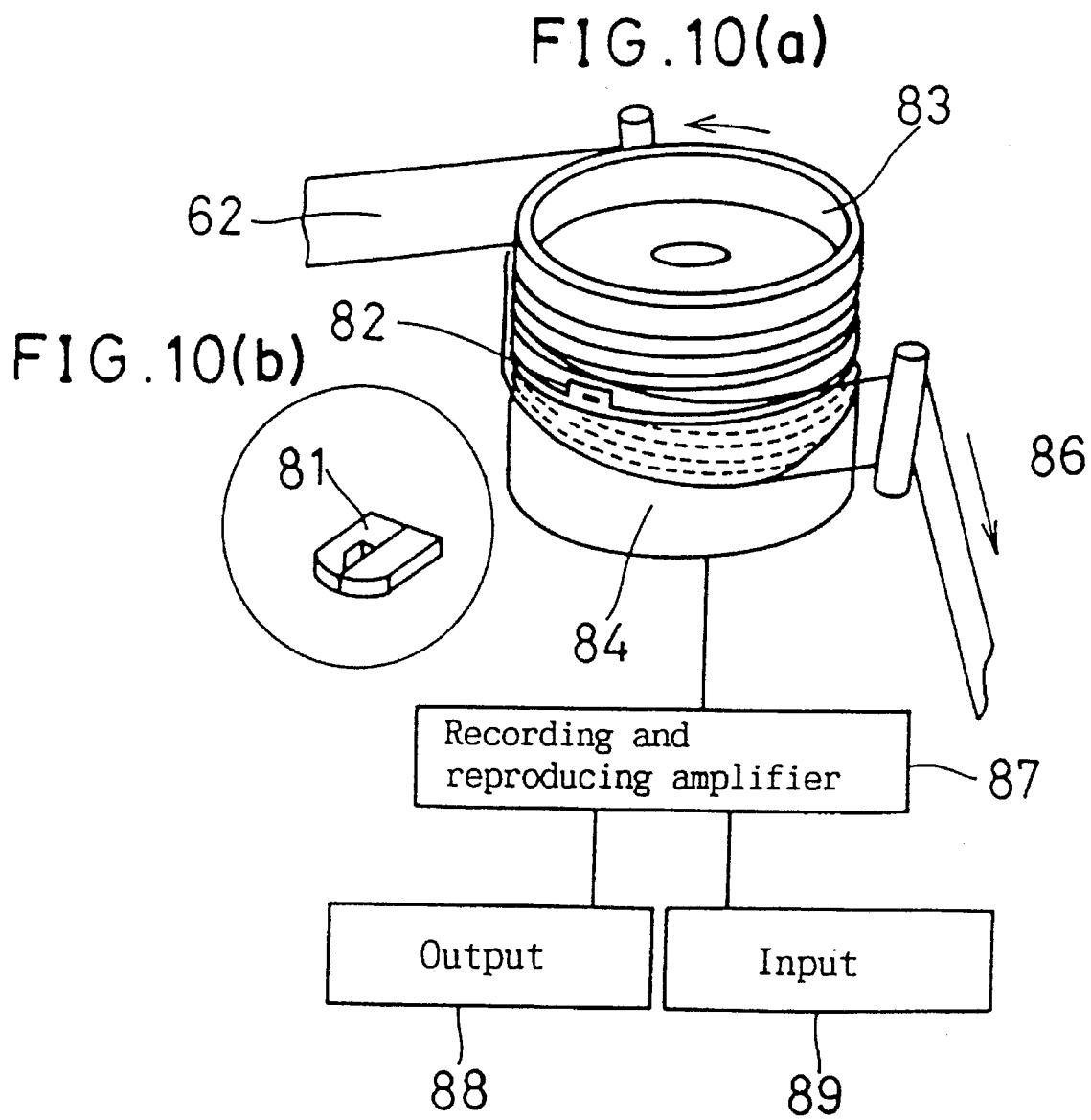
FIG. 10 is a perspective view showing an example of a magnetic recording and reproducing apparatus of this invention.

A bulk type magnetic head was manufactured by using a single crystal Mn—Zn ferrite having anisotropy in the initial permeability ($Fe_2O_3$=54%, MnO=27%, ZnO=19%, initial permeability at (100) direction=500, initial permeability at (110) direction =400). In other words, by using this single crystal Mn—Zn ferrite, a magnetic head having the (100) axis direction in the rubbing direction 75 and the (110) axis direction in the gap depth direction 76 was manufactured as shown in FIG. 9. Therefore, in this embodiment, $\mu_1$ was 500 and $\mu_2$ was 400. As a Comparative Example 1, a magnetic head having the (110) axis direction in the rubbing direction and the (100) axis direction at gap depth direction was manufactured. In the Comparative Example 1, $\mu_1$ was 400 and $\mu_2$ was 500. Furthermore, as a Comparative Example 2, a magnetic head using a polycrystal ferrite having the permeability of 450 was manufactured. In the Comparative Example 2, $\mu_1$ was 450 and $\mu_2$ was 450. These magnetic heads were installed in a video tape recorder of VHS system having the structure shown in FIG. 10, and the recording and reproducing characteristics were compared. As shown in FIG. 10, the VTR apparatus functions such that a magnetic head 81 is mounted to a magnetic head mounting window 82 disposed on a rotating drum 83, and a magnetic tape 62 is wound helically around a fixed drum 84 and a rotating drum 83. The signals which are input via a reproducing amplifier 87 and recorded by a magnetic head 81 are once again read out at the magnetic head 81, and the signals are output after amplifying the signals with the reproducing amplifier 87. When the above-mentioned recording and reproducing characteristics of the magnetic heads were compared by the relative amounts, this embodiment shown in FIG. 9 had +1 dB, the Comparative Example 1 had −0.2 dB, and the Comparative Example 2 had +0.3 dB. Therefore, in a ring type magnetic head which sends and receives signals with a magnetic medium, it is effective to design such that the permeability at the tape rubbing direction of a material comprising the magnetic circuit becomes higher than the permeability at gap depth direction.

Moreover, this embodiment shown in FIG. 15 had $\mu_3/\mu_4$= 1.25, whereas the Comparative Example 1 had $\mu_3/\mu_4$=0.8 and the Comparative Example 2 was $\mu_3/\mu_4$=1.0. As a result, the calculation results proved that this embodiment had higher output characteristics than that of the Comparative Examples 1 and 2.

Furthermore, in a ring type magnetic head 111 which sends and receives signals with a magnetic medium as shown in FIG. 15, at least the material composing the head comprises a bonded ferrite bonding a single crystal ferrite 113 and a polycrystal ferrite 112, and when the tape rubbing surface has the permeability $\mu_5$ at tape rubbing direction 115 with the single crystal ferrite 113 and has the magnetically isotropic permeability $\mu_6$ with the polycrystal ferrite 112, it becomes clear that the magnetic head is constructed to fulfill the following equation:

$$1.1 < \frac{\mu_5}{\mu_6} < 1.4 \qquad \text{(equation 19)}$$

In this embodiment, it was explained by referring to the bulk type magnetic head 38 shown in FIG. 5 (a), but it goes without saying that the same effects can be attained by using a metal-in-gap type magnetic head 39 shown in FIG. 5 (b), and a laminate type magnetic head 40 shown in FIG. 5 (b).

EXAMPLE 7

FIG. 10 is a schematic view showing an example of a magnetic recording and reproducing apparatus of this invention shows a tenth embodiment of this invention. In FIG. 10, 81 represents a magnetic head optimized by the above-mentioned analysis apparatus of magnetic characteristics of this invention, 82 represents a magnetic head mounting window, 83 represents a rotating drum 83, 84 represents a fixed drum, 62 represents a magnetic tape, and 86 represents a tape running direction. The above-mentioned ring type magnetic head having different permeabilities at tape rubbing direction and at gap depth direction in FIG. 10 is installed to the head mounting window 82 disposed on the rotating drum 83. The magnetic recording and reproducing are conducted by the relative movement of the magnetic head 81 and the magnetic tape 62. In this way, a magnetic recording apparatus having high recording and reproducing characteristics can be obtained. Although this embodiment referred to an upper drum rotating system such as VTR of VHS system, 8 mm VTR system, and DAT, it goes without saying that this invention can be also used for the D2 system etc. having a middle drum rotating system, an audio cassette recorder having a fixed pass system, or for magnetic heads such as a hard disc and a floppy disc. By using a magnetic head optimized by the above-noted apparatus for analysis of magnetic recording characteristics, it is considered as being possible to greatly improve the characteristics of the magnetic recording and reproducing apparatus.

The magnetic recording apparatus referred to in this embodiment can be used also as a recording apparatus for a photomagnetic apparatus using a magnetic head in the recording or in the reproducing process.

In this embodiment, it was explained by referring to a bulk type magnetic head, but it goes without saying that the same effects can be attained by using a metal in gap type magnetic head and a laminate type magnetic head. Also, it was explained by referring to a ring type magnetic head, but the above-mentioned apparatus for analysis of magnetic recording characteristics is also applicable for a non-ring type magnetic head such as a single magnetic pole head used for vertical recording. It is obvious that the method of this invention is effective for optimizing magnetic characteristics of a magnetic device such as a transformer or a LCR circuit.

The analysis part of magnetic characteristics of this invention may be attained from the viewpoint of software or of firmware by using a computer.

In addition, it is also effective to neuro-process the output results and by learning to optimize the size, form, structure, thermodynamics of the composite material, magnetic characteristics such as magnetostriction, and the like.

The invention may be embodied in other forms without departing from the spirit or essential characteristics thereof. The embodiments disclosed in this application are to be considered in all respects as illustrative and not as restrictive. The scope of the invention is indicated by the appended claims rather than by the foregoing description, and all changes which come within the meaning and range of equivalency of the claims are intended to be embraced therein.

What is claimed is:

1. A method for analysis of magnetic characteristics of a magnetic device conducted by measuring magnetic characteristics of the magnetic device composed of a magnetic material and a non magnetic material with the use of an analysis apparatus, and comprising the steps of:

inputting data related to characteristics of the substances composing said magnetic device, data related to a structure of said magnetic device divided into a plurality of parts, data concerning boundary conditions for analysis of the structure of said magnetic device, and data concerning boundary conditions for analysis of a magnetic field of said magnetic device into said analysis apparatus, obtaining a stress distribution for each of the plurality of divided parts on the basis of the data related to said boundary conditions, obtaining magnetic characteristics for each of said plurality of parts based on the data concerning the boundary conditions of the magnetic field and the stress distribution of said magnetic device, and obtaining magnetic characteristics of the whole magnetic device based on said magnetic characteristics for each of said plurality of parts.

2. The method for analysis of magnetic characteristics of a magnetic device according to claim 1, wherein magnetic characteristics of the entire magnetic device are obtained by solving an equation for obtaining magnetic flux and direction of magnetic flux for each of the plurality of parts by using the data related to the boundary conditions for analysis of the magnetic field and the stress distribution of the magnetic device, in combination and simultaneously with an equation for obtaining magnetic characteristics of the whole magnetic device from the continuous formulas of magnetic flux.

3. The method for analysis of magnetic characteristics of a magnetic device according to claim 1, wherein convergence solutions of magnetic characteristics of the entire magnetic device are obtained by solving an equation for obtaining magnetic flux and direction of magnetic flux for each of the plurality of parts by using the data related to the boundary conditions for analysis of the magnetic field and the stress distribution of said magnetic device, alternately with an equation for obtaining magnetic characteristics of the whole magnetic device from the continuous formulas of magnetic flux.

4. The method for analysis of magnetic characteristics of a magnetic device according to claim 1, wherein magnetic characteristics of the entire magnetic device are obtained by solving an equation for obtaining an absolute value of initial permeability and anisotropy of initial permeability for each of the plurality of parts by using the data related to the boundary conditions for analysis of the magnetic field and the stress distribution of the magnetic device, in combination and simultaneously with an equation for obtaining magnetic characteristics of the whole magnetic device from the continuous formulas of magnetic flux.

5. The method for analysis of magnetic characteristics of a magnetic device according to claim 1, wherein convergence solutions of magnetic characteristics of the whole magnetic device are obtained by solving an equation for obtaining an absolute value of initial permeability and anisotropy of initial permeability for each of the plurality of parts by using the data related to the boundary conditions for analysis of the magnetic field and the stress distribution of the magnetic device, alternately with an equation for obtaining magnetic characteristics of the whole magnetic device from the continuous formulas of magnetic flux.

6. The method for analysis of magnetic characteristics of a magnetic device according to claim 1, wherein said magnetic device comprises a magnetic head, and stress imposed on the plurality of parts is at least one force selected from the group consisting of thermal stress caused by the difference of thermal expansion coefficients in the composite material and pressure added externally, and the magnetic characteristics comprise at least one of the magnetic recording characteristics selected from the group consisting of strength of magnetic field generated at a magnetic gap part by an excited coil and magnetic strength of a magnetic medium body.

7. The method for analysis of magnetic characteristics of a magnetic device according to claim 1, wherein said magnetic device comprises a magnetic head, and stress imposed on the plurality of parts is at least one force selected from the group consisting of thermal stress caused by the difference of thermal expansion coefficients in the composite material and pressure added externally, and the magnetic characteristics comprise at least one of the magnetic recording and reproducing characteristics selected from the group consisting of magnetic flux density at a magnetic gap part, electromotive force caused in a coil disposed at the interlinkage with a magnetic circuit, and amount of magnetic flux at the interlinkage with the coil.

8. The method for analysis of magnetic characteristics of a magnetic device according to claim 1, wherein an equation for obtaining magnetic characteristics against a magnetic field for each of the plurality of parts by using the data related to the boundary conditions for analysis of the magnetic field and the stress distribution of the magnetic device solves at least one equation of motion selected from the group consisting of a domain wall motion and a magnetization rotation, has frequency dependency including a damping-constant, and obtains frequency dependency of said magnetic device.

9. An apparatus for analysis of magnetic characteristics of a magnetic device used for measuring magnetic characteristics of a magnetic device comprising: a magnetic material and a non magnetic material comprises at least a data input part, in which data related to characteristics of the substances composing the magnetic device, data related to a structure of the magnetic device divided into a plurality of parts, data concerning boundary conditions for analysis of the structure, and data concerning boundary conditions for analysis of a magnetic field of said magnetic device are input, and an analysis part, in which a stress distribution for each of the plurality of parts divided on the basis of the data related to the boundary conditions is obtained, and magnetic characteristics for each of said plurality of parts based on the data concerning said boundary conditions and said stress distribution are obtained, and magnetic characteristics of the whole magnetic device are obtained based on the magnetic characteristics for each of said plurality of parts.

10. A magnetic head having a form and magnetic substances selected most suitably by measuring magnetic characteristics of the magnetic head composed of a magnetic material and a non magnetic material with the use of an analysis apparatus, and comprising the steps of:

inputting data related to characteristics of the substances composing said magnetic head, data related a structure of said magnetic head divided into a plurality of parts, data concerning boundary conditions for analysis of the structure of said magnetic head, and data concerning boundary conditions for analysis of a magnetic field of said magnetic head into said analysis apparatus, obtaining at least one stress distribution selected from the group consisting of thermal stress caused by the difference of thermal expansion coefficients of the composite material and pressure added externally, obtaining magnetic characteristics for each of said plurality of parts based on the data concerning the boundary conditions for analysis of the magnetic field and the stress distribution of said magnetic head including at least one strength selected from the group consisting of strength of magnetic field generated at a magnetic gap part by an excited coil and magnetic strength of a magnetic recording medium, and obtaining magnetic recording characteristics of the whole magnetic head based on the magnetic recording characteristics for each of said plurality of parts.

11. A magnetic head having a form and magnetic substances selected most suitably by measuring magnetic characteristics of the magnetic head composed of a magnetic material and a non magnetic material with the use of an analysis apparatus, and comprising the steps of:

inputting data related to characteristics of the substances composing said magnetic head, data related to a structure of said magnetic head divided into a plurality of parts, data concerning boundary conditions for analysis of the structure of said magnetic head, and data concerning boundary conditions for analysis of a magnetic field of said magnetic head into said analysis apparatus, obtaining at least one stress distribution selected from the group consisting of thermal stress caused by the difference of thermal expansion coefficients of the composite material and pressure added externally, obtaining magnetic recording and reproducing characteristics for each of said plurality of parts based on the data concerning the boundary conditions for analysis of the magnetic field and the stress distribution of said magnetic head, obtaining magnetic recording and reproducing characteristics including at least one element selected from the group consisting of magnetic flux density at a magnetic gap part, electromotive force caused in a coil disposed at the interlinkage with a magnetic circuit, and amount of magnetic flux at the interlinkage with the coil, and obtaining magnetic recording characteristics of the whole magnetic head based on the magnetic recording and reproducing characteristics for each of said plurality of parts.

12. A magnetic recording and reproducing apparatus for conducting recording and reproducing of information by relatively moving a magnetic head composed of a magnetic material and a non magnetic material and a magnetic medium, having a form and magnetic substances selected most suitably by measuring magnetic characteristics of the magnetic head with the use of an analysis apparatus, and comprising the steps of:

inputting data related to characteristics of the substances composing said magnetic head, data related to a structure of said magnetic head divided into a plurality of parts, data concerning boundary conditions for analysis of the structure of said magnetic head, and data concerning boundary conditions for analysis of a magnetic field of said magnetic head into said analysis apparatus, obtaining at least one stress distribution selected from the group consisting of thermal stress caused by the difference of thermal expansion coefficients of the composite material and pressure added externally, obtaining magnetic characteristics for each of said plurality of parts based on the data concerning the boundary conditions for analysis of the magnetic field and the stress distribution of said magnetic head including at least one strength selected from the group consisting of strength of magnetic field generated at a magnetic gap part by an excited coil and magnetic strength of a magnetic recording medium, and obtaining magnetic recording characteristics of the whole magnetic head based on the magnetic recording characteristics for each of said plurality of parts.

13. A magnetic recording and reproducing apparatus for conducting recording and reproducing of information by relatively moving a magnetic head composed of a magnetic material and a non magnetic material and a magnetic medium, having a form and magnetic substances selected most suitably by measuring magnetic characteristics of the magnetic head with the use of an analysis apparatus, and comprising the steps of:

inputting data related to characteristics of the substances composing said magnetic head, data related to said magnetic head divided into a plurality of parts, data concerning boundary conditions for analysis of the structure of said magnetic head, and data concerning boundary conditions for analysis of a magnetic field of said magnetic head into said analysis apparatus, obtaining at least one stress distribution selected from the group consisting of thermal stress caused by the difference of thermal expansion coefficients of the composite material and pressure added externally, obtaining magnetic characteristics for each of said plurality of parts on the basis of the data concerning the boundary conditions for analysis of the magnetic field and the stress distribution of said magnetic head including at least one element selected from the group consisting of magnetic flux density at a magnetic gap part, electromotive force caused in a coil disposed at the interlinkage with a magnetic circuit, and amount of magnetic flux at the interlinkage with the coil, and obtaining magnetic recording characteristics of the whole magnetic head based on the magnetic recording and reproducing characteristics for each of said plurality of parts.

* * * * *